United States Patent
Sano et al.

(10) Patent No.: US 9,711,348 B2
(45) Date of Patent: Jul. 18, 2017

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: HITACHI KOKUSAI ELECTRIC INC., Tokyo (JP)

(72) Inventors: Atsushi Sano, Toyama (JP); Yoshiro Hirose, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/859,924

(22) Filed: Sep. 21, 2015

(65) Prior Publication Data

US 2016/0086791 A1 Mar. 24, 2016

(30) Foreign Application Priority Data

Sep. 24, 2014 (JP) ................................ 2014-194226

(51) Int. Cl.
*H01L 21/02* (2006.01)
*C23C 16/52* (2006.01)
(Continued)

(52) U.S. Cl.
CPC ............ *H01L 21/022* (2013.01); *C23C 16/30* (2013.01); *C23C 16/45531* (2013.01);
(Continued)

(58) Field of Classification Search
CPC ............ H01L 21/0228; H01L 21/02167; H01L 21/022; H01L 21/02211; H01L 21/02274;
(Continued)

(56) References Cited

U.S. PATENT DOCUMENTS

| 8,546,272 B2 | 10/2013 | Hirose et al. |
| 2014/0057452 A1 | 2/2014 | Hashimoto et al. |
| 2014/0073142 A1 | 3/2014 | Hirose et al. |

FOREIGN PATENT DOCUMENTS

| JP | 2011-238894 A | 11/2011 |
| JP | 2014-041975 A | 3/2014 |
| JP | 2014-056871 A | 3/2014 |

OTHER PUBLICATIONS

Korean Office Action issued on Dec. 14, 2016 in the Korean Application No. 10-2015-0132165.

*Primary Examiner* — Caleen Sullivan
(74) *Attorney, Agent, or Firm* — Volpe and Koenig, P.C.

(57) ABSTRACT

The present invention increases controllability of a composition ratio of a multi-element film that contains a predetermined element and at least one element selected from the group consisting of boron, oxygen, carbon and nitrogen. There is provided a method of manufacturing a semiconductor device, including: forming a laminated film where a first film and a second film are laminated on a substrate by performing a cycle a predetermined number of times, the cycle including: (a) forming the first film being free of borazine ring structure and including a predetermined element and at least one element selected from the group consisting of oxygen, carbon and nitrogen; and (b) forming the second film having a borazine ring structure and including at least boron and nitrogen.

13 Claims, 12 Drawing Sheets

(51) Int. Cl.
*C23C 16/455* (2006.01)
*H01L 21/67* (2006.01)
*C23C 16/30* (2006.01)

(52) U.S. Cl.
CPC .......... *C23C 16/52* (2013.01); *H01L 21/0217* (2013.01); *H01L 21/0228* (2013.01); *H01L 21/02118* (2013.01); *H01L 21/02167* (2013.01); *H01L 21/02211* (2013.01); *H01L 21/02274* (2013.01); *H01L 21/67109* (2013.01); *H01L 21/67115* (2013.01); *H01L 21/67248* (2013.01)

(58) Field of Classification Search
CPC ........... H01L 21/02126; H01L 21/0217; H01L 21/02271; C23C 16/30; C23C 16/36; C23C 16/52; C23C 16/45527; C23C 16/45546; C23C 16/345; C23C 16/38; C23C 16/45523; C23C 16/45525; C23C 16/45542; C23C 16/45553
USPC ........................................................ 438/763
See application file for complete search history.

FIG. 5

| SiBCN FILM BASE | SiBN FILM BASE | BCN FILM BASE | BN FILM BASE |
|---|---|---|---|
| SiOCN/SiBCN | SiOCN/SiBN | SiOCN/BCN | SiOCN/BN |
| SiOC/SiBCN | SiOC/SiBN | SiOC/BCN | SiOC/BN |
| SiCN/SiBCN | SiCN/SiBN | SiCN/BCN | SiCN/BN |
| SiN/SiBCN | SiN/SiBN | SiN/BCN | SiN/BN |
| SiON/SiBCN | SiON/SiBN | SiON/BCN | SiON/BN |
| SiO/SiBCN | SiO/SiBN | SiO/BCN | SiO/BN |
| SiC/SiBCN | SiC/SiBN | SiC/BCN | SiC/BN |

MODIFICATIONS 1 TO 6
MODIFICATIONS 7 TO 9
MODIFICATIONS 10 TO 27
<FIRST FILM/SECOND FILM>

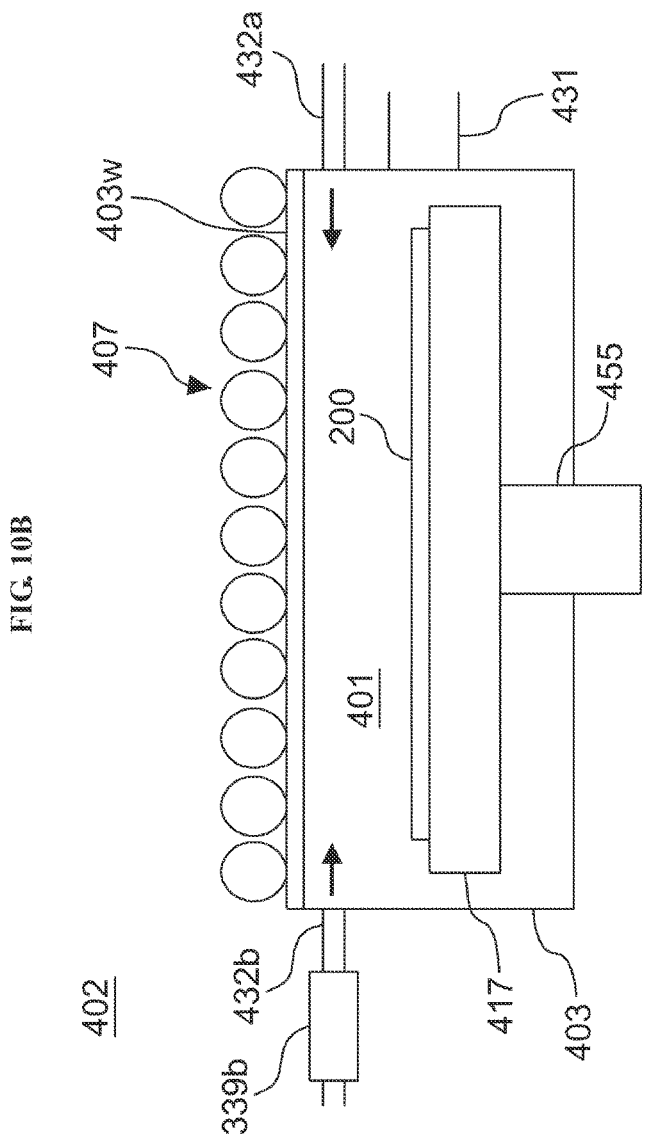

US 9,711,348 B2

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. §119 of Japanese Patent Application No. 2014-194226, filed on Sep. 24, 2014, the entire contents of which are hereby incorporated by reference.

BACKGROUND OF THE INVENTION

1. Field of the Invention

The present invention relates to a method of manufacturing a semiconductor device, a substrate processing apparatus and a non-transitory computer-readable recording medium.

2. Description of the Related Art

Among processes of manufacturing a semiconductor apparatus (semiconductor device), a process of forming a multi-element film containing a predetermined element such as silicon (Si); and at least one element (hereinafter referred to as a "specific element") selected from the group consisting of boron (B), oxygen (O), carbon (C) and nitrogen (N) on a substrate may be performed.

SUMMARY OF THE INVENTION

The present invention provides a technology for increasing controllability of a composition ratio of a multi-element film containing a predetermined element; and at least one specific element selected from the group consisting of boron, oxygen, carbon and nitrogen.

According to an aspect of the present invention, there is provided a method of manufacturing a semiconductor device, including: forming a laminated film in which a first film and a second film are laminated on a substrate by performing a cycle a predetermined number of times, the cycle including:

(a) forming the first film being free of a borazine ring structure and including a predetermined element and at least one element selected from the group consisting of oxygen, carbon and nitrogen; and (b) forming the second film having the borazine ring structure and including at least boron and nitrogen.

BRIEF DESCRIPTION OF THE DRAWINGS

FIG. 5 shows a table in which laminate films that can be formed on a substrate are exemplified.

FIG. 10b is a schematic configuration diagram of a processing furnace of a substrate processing apparatus preferably used in another embodiment of the present invention and is a vertical cross-sectional view of a processing furnace portion.

DETAILED DESCRIPTION OF THE PREFERRED EMBODIMENTS

An Embodiment of the Present Invention

Hereinafter, an embodiment of the present invention will be described with reference to FIGS. 1 through 3.

(1) Configuration of Substrate Processing Apparatus

Figure 1:
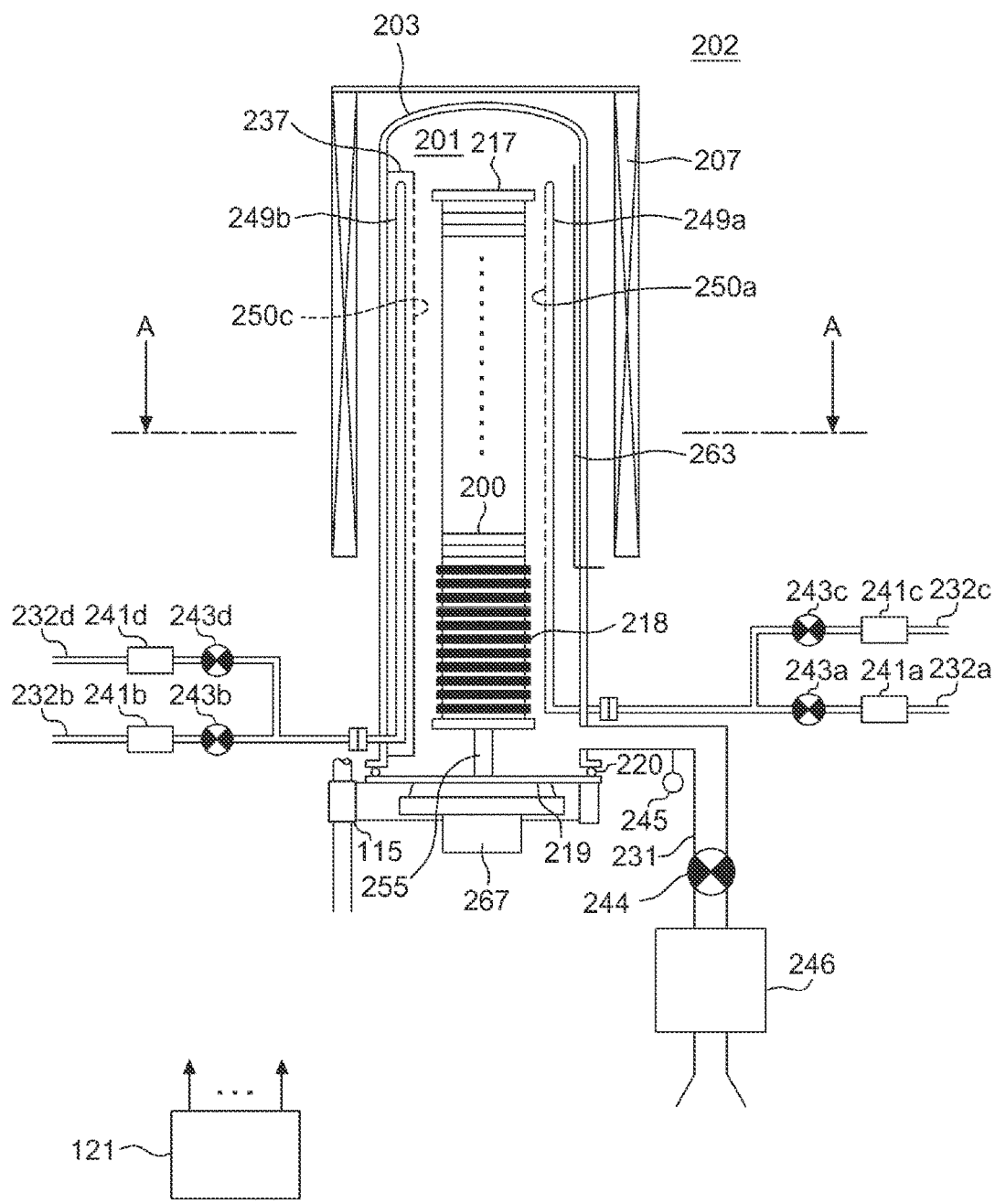
FIG. 1 is a schematic configuration diagram of a vertical processing furnace of a substrate processing apparatus preferably used in an embodiment of the present invention and is a vertical cross-sectional view of a processing furnace portion.

As illustrated in FIG. 1, a processing furnace 202 includes a heater 207 serving as a heating unit (heating mechanism). The heater 207 has a cylindrical shape and is vertically provided with support from a heater base (not illustrated) serving as a holding plate. As will be described below, the heater 207 also serves as an activating device (exciting unit) for activating (exciting) a gas by heat.

In the heater 207, a reaction tube 203 forming a reaction container (process container) is provided concentrically with the heater 207. The reaction tube 203 is made of a heat-resistant material such as quartz ($SiO_2$) or silicon carbide (SiC), and is formed in a cylindrical shape whose upper end is closed and whose lower end is opened. A process chamber 201 is formed in a cylindrical hollow portion of the reaction tube 203. The process chamber 201 is configured such that wafers 200 may be accommodated as substrates in a horizontal orientation to be arranged on multiple stages in a vertical direction by a boat 217 to be described below.

Nozzles 249a and 249b are provided in the process chamber 201 to penetrate a lower sidewall of the reaction tube 203. The nozzles 249a and 249b are made of a heat-resistant material such as quartz or SiC. Gas supply pipes 232a and 232b are connected to the nozzles 249a and 249b, respectively. In this manner, the two nozzles 249a and 249b and the two gas supply pipes 232a and 232b are provided in the reaction tube 203 to supply a plurality of types of gases into the process chamber 201.

However, the processing furnace 202 of the present embodiment is not limited to the above-described form. For example, a manifold made of a metal may be provided below the reaction tube 203 to support the reaction tube 203, and each of the nozzles may be provided to penetrate sidewalls of the manifold. In this case, an exhaust pipe 231 to be described below may be further provided in the manifold. In this case, the exhaust pipe 231 may also be provided below the reaction tube 203 rather than in the manifold. In this manner, a furnace port portion of the processing furnace 202 may be made of a metal, and the nozzle and the like may be provided at the furnace port portion made of a metal.

In the gas supply pipes 232a and 232b, in order from an upstream end, flow rate controllers (MFCs) 241a and 241b serving as flow rate controllers (flow rate control units) and valves 243a and 243b serving as on-off valves are provided, respectively. Gas supply pipes 232c and 232d configured to supply an inert gas are connected downstream from the valves 243a and 243b of the gas supply pipes 232a and 232b. In the gas supply pipes 232c and 232d, in order from an upstream end, MFCs 241c and 241d serving as flow rate controllers (flow rate control units) and valves 243c and 243d serving as on-off valves are provided, respectively.

The nozzle 249a is connected to a leading end of the gas supply pipe 232a. As illustrated in FIG. 2, the nozzle 249a is provided in a cylindrical space between an inner wall of the reaction tube 203 and the wafer 200, from a lower inner wall to an upper inner wall of the reaction tube 203, to rise in a direction in which the wafers 200 are arranged. That is, the nozzle 249a is provided along a wafer arrangement region in which the wafers 200 are arranged, in a region that horizontally surrounds the wafer arrangement region at sides of the wafer arrangement region. That is, the nozzle 249a is vertically provided with respect to a surface (flat surface) of the wafer 200a at sides of ends (peripheral portions) of the wafers 200 loaded in the process chamber 201. The nozzle 249a is configured as an L-shaped long nozzle, and includes a horizontal portion provided to penetrate a lower sidewall of the reaction tube 203 and a vertical portion provided to rise at least from one end to the other end of the wafer arrangement region. A gas supply hole 250a configured to supply a gas is provided at a side surface of the nozzle 249a. The gas supply hole 250a may be opened to the center of the reaction tube 203 to supply a gas to the wafer 200. A plurality of gas supply holes 250a are provided from a lower part to an upper part of the reaction tube 203, and are provided to each have the same opening area at the same opening pitch.

The nozzle 249b is connected to a leading end of the gas supply pipe 232b. The nozzle 249b is provided in a buffer chamber 237. The buffer chamber 237 also serves as a gas dispersion space. The buffer chamber 237 is provided in a cylindrical space between the inner wall of the reaction tube 203 and the wafer 200 and is provided in a part from the lower inner wall to the upper inner wall of the reaction tube 203 in the direction in which the wafers 200 are arranged. That is, the buffer chamber 237 is provided along the wafer arrangement region in a region that horizontally surrounds the wafer arrangement region at sides of the wafer arrangement region. That is, the buffer chamber 237 is provided at sides of ends of the wafers 200 loaded in the process chamber 201. A gas supply hole 250c configured to supply a gas is provided at an end of a wall adjacent to the wafer 200 of the buffer chamber 237. The gas supply hole 250c may be opened to the center of the reaction tube 203 to supply a gas to the wafer 200. A plurality of gas supply holes 250c are provided from the lower part to the upper part of the reaction tube 203, and are provided to each have the same opening area at the same opening pitch.

The nozzle 249b is provided at an end opposite to an end at which the gas supply hole 250c of the buffer chamber 237 is provided, from the lower inner wall to the upper inner wall of the reaction tube 203, to rise in the direction in which the wafers 200 are arranged. That is, the nozzle 249b is provided along the wafer arrangement region in which the wafers 200 are arranged, in a region that horizontally surrounds the wafer arrangement region at sides of the wafer arrangement region. That is, the nozzle 249b is vertically provided with respect to a surface of the wafer 200 at sides of ends of the wafers 200 loaded in the process chamber 201. The nozzle 249b is configured as the L-shaped long nozzle, and includes a horizontal portion provided to penetrate a lower sidewall of the reaction tube 203 and a vertical portion provided to rise at least from one end to the other end of the wafer arrangement region. A gas supply hole 250b configured to supply a gas is provided at a side surface of the nozzle 249b. The gas supply hole 250b is opened to the center of the buffer chamber 237. Similarly to the gas supply hole 250c, a plurality of gas supply holes 250b are provided from the lower part to the upper part of the reaction tube 203. When a difference between pressures in the buffer chamber 237 and the process chamber 201 is small, the plurality of gas supply holes 250b may be formed to each have the same opening area at the same opening pitch from an upstream end (lower part) to a downstream end (upper part). Also, when a difference between pressures in the buffer chamber 237 and the process chamber 201 is large, the opening areas of the gas supply holes 250b may gradually increase from the upstream end to the downstream end or the opening pitch between the gas supply holes 250b may gradually decrease from the upstream end to the downstream end.

By adjusting the opening area or the opening pitch of the gas supply holes 250b from the upstream end to the downstream end as described above, it is possible to spray gases at different flow velocities but substantially the same flow rate through each of the gas supply holes 250b. Also, when the gases sprayed from each of the plurality of gas supply holes 250b are introduced into the buffer chamber 237, different flow velocities of the gases may be uniformized in the buffer chamber 237. When the gases are sprayed into the buffer chamber 237 through the plurality of gas supply holes 250b, speeds of particles of each gas are reduced in the buffer chamber 237, and then the gases are sprayed into the process chamber 201 through the plurality of gas supply holes 250c. When the gases sprayed into the buffer chamber 237 through each of the plurality of gas supply holes 250b are sprayed into the process chamber 201 through each of the gas supply holes 250c, the gases each have a uniform flow rate and flow velocity.

In this manner, in the present embodiment, the gas is transferred through a longitudinally extending space having a cylindrical shape defined by an inner sidewall of the reaction tube 203 and ends (peripheral portions) of the plurality of wafers 200 arranged in the reaction tube 203, that is, through the nozzles 249a and 249b and the buffer chamber 237 disposed in the cylindrical space. Also, through the gas supply holes 250a through 250c that are opened to the nozzles 249a and 249b and the buffer chamber 237, respectively, the gas is initially sprayed into the reaction tube 203 in the vicinity of the wafer 200. Also, a main flow of the gas in the reaction tube 203 is set in a direction parallel to a surface of the wafer 200, that is, a horizontal direction. In such a configuration, it is possible to uniformly supply the gas to each of the wafers 200, thereby increasing film thickness uniformity of a thin film to be formed on each of the wafers 200. The gas flowing along a surface of the wafer 200, that is, a residual gas after a reaction, flows toward an exhaust port, that is, toward the exhaust pipe 231 to be described below. However, a flow direction of the residual gas is not limited to the vertical direction, but may be appropriately defined according to a location of the exhaust port.

Through the gas supply pipe 232a, as a source gas containing a predetermined element, for example, a halosilane source gas containing silicon as the predetermined element and a halogen element is supplied into the process chamber 201 through the MFC 241a, the valve 243a and the nozzle 249a.

The halosilane source gas refers to a halosilane source in a gas state, for example, a gas that is obtained by vaporizing a halosilane source that is in a liquid state under room temperature and normal pressure, a halosilane source that is in a gas state under room temperature and normal pressure or the like. The halosilane source is a silane source including a halogen group. The halogen group includes a chloro group, a fluoro group, a bromo group, an iodo group and the like. That is, the halogen group includes a halogen element such as chlorine (Cl), fluorine (F), bromine (Br), iodine (I) or the like. The halosilane source may be a type of halide. When the term "source" is used in this specification, it may refer to either or both of "a liquid source in a liquid state" or "a source gas in a gas state."

Figure 6A:
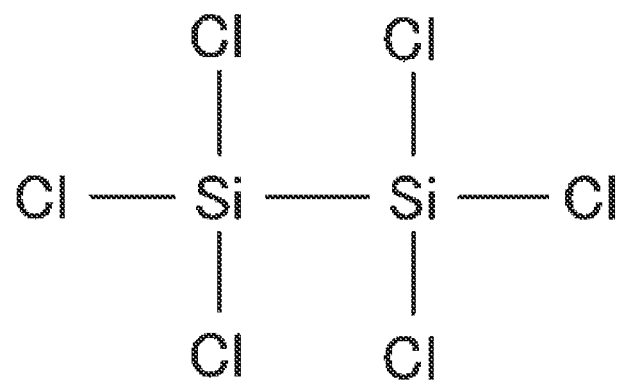
FIG. 6a shows a chemical structural formula of HCDS.
Figure 6B:
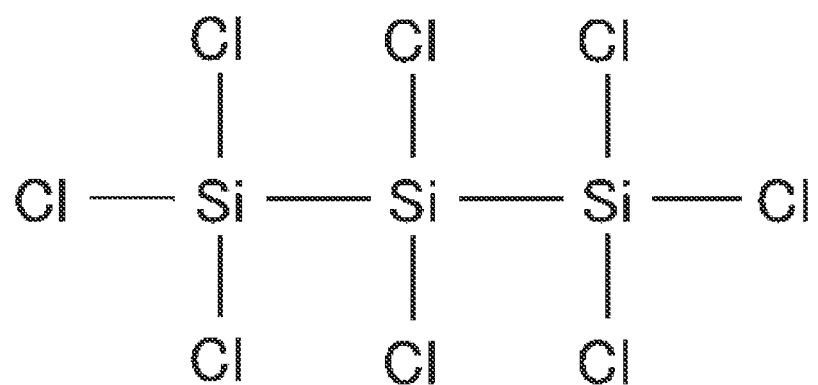
FIG. 6b shows a chemical structural formula of OCTS.

As the halosilane source gas, for example, a carbon-free source gas containing silicon and chlorine, that is, an inorganic chlorosilane source gas, may be used. As the inorganic chlorosilane source gas, for example, hexachlorodisilane ($Si_2Cl_6$, abbreviation: HCDS) gas or octachlorotrisilane ($Si_3Cl_8$, abbreviation: OCTS) gas may be used. FIG. 6a shows a chemical structural formula of HCDS, and FIG. 6b shows a chemical structural formula of OCTS. These gases may be a source gas that contains at least two silicon atoms in a molecule, includes chlorine and has a Si—Si bond. These gases serve as a silicon source in a substrate processing process to be described below.

Figure 7A:
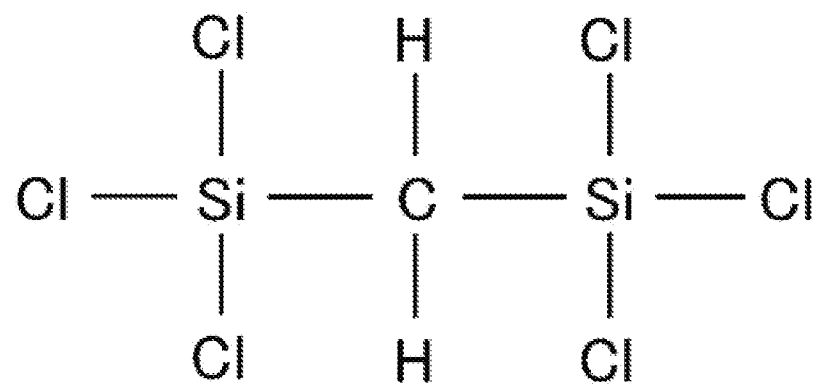
FIG. 7a shows a chemical structural formula of BTCSM.
Figure 7B:
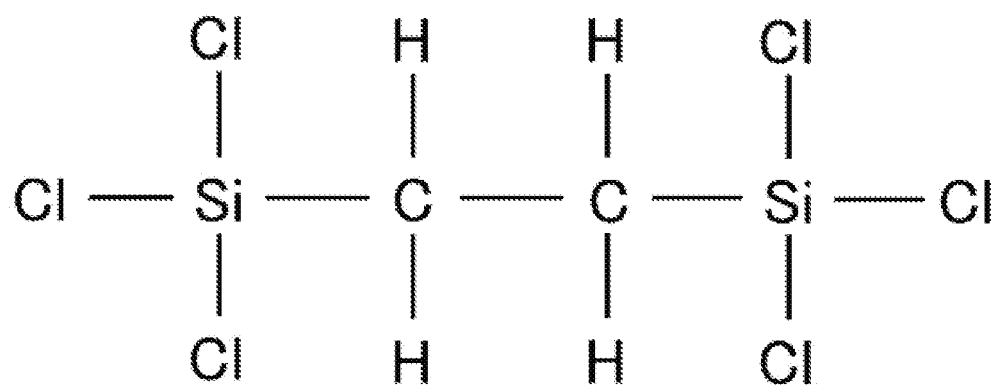
FIG. 7b shows a chemical structural formula of BTCSE.

Also, as the halosilane source gas, for example, a source gas that contains silicon, chlorine and an alkylene group and has a S—C bond, that is, an alkylene chlorosilane source gas, which is an organic chlorosilane source gas, may be used. The alkylene group includes a methylene group, an ethylene group, a propylene group, a butylene group and the like. The alkylene chlorosilane source gas may also be called an alkylene halosilane source gas. As the alkylene chlorosilane source gas, for example, bis(trichlorosilyl)methane [$(SiCl_3)_2CH_2$, abbreviation: BTCSM] gas, ethylenebis (trichlorosilane) gas, that is, 1,2-bis(trichlorosilyl)ethane [$(SiCl_3)_2C_2H_4$, abbreviation: BTCSE] gas or the like may be used. FIG. 7a shows a chemical structural formula of BTCSM, and FIG. 7b shows a chemical structural formula of BTCSE. These gases may be a source gas that contains at least two silicon atoms in a molecule, includes carbon and chlorine, and has a S—C bond. These gases serve as a silicon source and a carbon source in the substrate processing process to be described below.

Figure 8A:
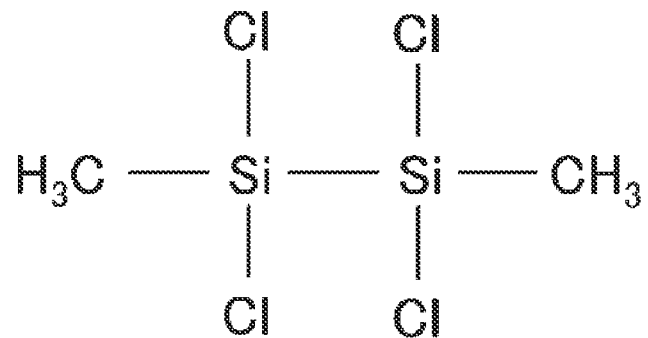
FIG. 8a shows a chemical structural formula of TCDMDS.
Figure 8B:
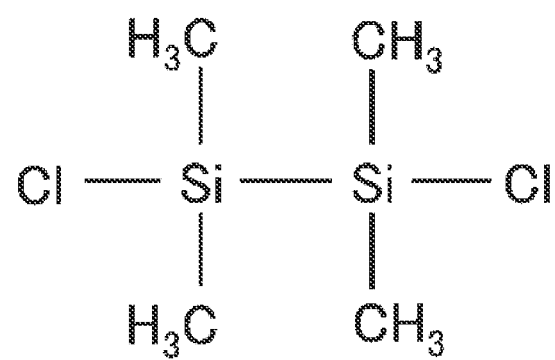
FIG. 8b shows a chemical structural formula of DCTMDS.
Figure 8C:
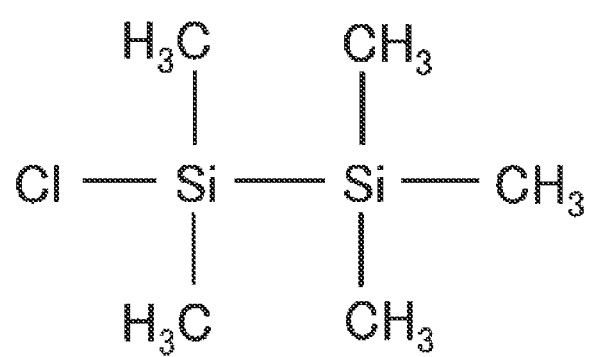
FIG. 8c shows a chemical structural formula of MCPMDS.

Also, as the halosilane source gas, for example, a source gas that includes silicon, chlorine and an alkyl group and has a S—C bond, that is, an alkyl chlorosilane source gas, which is an organic chlorosilane source gas, may be used. The alkyl group includes a methyl group, an ethyl group, a propyl group, a butyl group and the like. The alkyl chlorosilane source gas may also be called an alkyl halosilane source gas. As the alkyl chlorosilane source gas, for example, 1,1,2,2-tetrachloro-1,2-dimethylsilane [$(CH_3)_2Si_2Cl_4$, abbreviation: TCDMDS] gas, 1,2-dichloro-1,1,2,2-tetramethyldisilane [$(CH_3)_4Si_2Cl_2$, abbreviation: DCTMDS] gas or 1-monochloro-1,1,2,2,2-pentamethyldisilane [$(CH_3)_5Si_2Cl$, abbreviation: MCPMDS] gas may be used. FIG. 8a shows a chemical structural formula of TCDMDS, FIG. 8b shows a chemical structural formula of DCTMDS, and FIG. 8c shows a chemical structural formula of MCPMDS. These gases may be a source gas that contains at least two silicon atoms in a molecule, includes carbon and chlorine, and has a S—C bond. These gases also have Si—Si bonds. These gases serve as a silicon source and a carbon source in the substrate processing process to be described below.

When a liquid source that is in a liquid state under room temperature and normal pressure such as HCDS, BTCSM or TCDMDS is used, the source in a liquid state is vaporized by a vaporization system such as a vaporizer or a bubbler, and then is supplied as a source gas (such as HCDS gas, BTCSM gas and TCDMDS gas).

Also, through the gas supply pipe 232b, as a reactive gas having a different chemical structure from the source gas, for example, an oxygen (O)-containing gas is supplied into the process chamber 201 through the MFC 241b, the valve 243b, the nozzle 249b and the buffer chamber 237. The oxygen-containing gas serves as an oxidation gas, that is, an oxygen source, in the substrate processing process to be described below. As the oxygen-containing gas, for example, oxygen ($O_2$) gas may be used.

Also, through the gas supply pipe 232b, as a reactive gas having a different chemical structure from the source gas, for example, a carbon (C)-containing gas is supplied into the process chamber 201 through the MFC 241b, the valve 243b, the nozzle 249b and the buffer chamber 237. As the carbon-containing gas, for example, a hydrocarbon-based gas may be used. The hydrocarbon-based gas may be a material formed of only two elements, carbon and hydrogen, and serve as a carbon source in the substrate processing process to be described below. As the hydrocarbon-based gas, for example, propylene ($C_3H_6$) gas may be used.

Also, through the gas supply pipe 232b, as a reactive gas having a different chemical structure from the source gas, for example, a nitrogen (N)-containing gas is supplied into the process chamber 201 through the MFC 241b, the valve 243b, the nozzle 249b and the buffer chamber 237. As the nitrogen-containing gas, for example, a hydronitrogen-based gas may be used. The hydronitrogen-based gas may be a material formed of only two elements, nitrogen and hydrogen, and serve as a nitriding gas, that is, a nitrogen source, in the substrate processing process to be described below. As the hydronitrogen-based gas, for example, ammonia ($NH_3$) gas may be used.

Also, through the gas supply pipe 232b, as a reactive gas having a different chemical structure from the source gas, for example, a gas containing nitrogen (N) and carbon (C) is supplied into the process chamber 201 through the MFC 241b, the valve 243b, the nozzle 249b and the buffer chamber 237. As the gas containing nitrogen and carbon, for example, an amine-based gas may be used.

The amine-based gas refers to an amine in a gas state, for example, a gas that is obtained by vaporizing an amine in a liquid state under room temperature and normal pressure or a gas including an amine group such as an amine in a gas state under room temperature and normal pressure. The amine-based gas includes an amine such as ethylamine, methylamine, propylamine, isopropylamine, butylamine and isobutylamine. The amine is a general term for compounds in which a hydrogen atom of ammonia ($NH_3$) has been replaced with a hydrocarbon group such as an alkyl group. The amine includes a hydrocarbon group such as an alkyl group as a ligand containing carbon, that is, an organic ligand. Because the amine-based gas includes three elements, carbon, nitrogen and hydrogen, and does not include silicon, it may be called a silicon-free gas. Since the amine-based gas does not include silicon or a metal, it may also be called a silicon-free and metal-free gas. The amine-based gas may be a material formed of only three elements, carbon, nitrogen and hydrogen. The amine-based gas serves as a nitrogen source and a carbon source in the substrate processing process to be described below. When the term "amine" is used in this specification, it may refer to either or both of "an amine in a liquid state" and "an amine-based gas in a gas state."

As the amine-based gas, for example, triethylamine [$(C_2H_5)_3N$, abbreviation: TEA] gas that includes a plurality of ligands (ethyl groups) containing carbon atoms in its chemical structural formula (in a molecule) and includes a greater number of carbon atoms than nitrogen atoms in a molecule may be used. When an amine in a liquid state under room temperature and normal pressure such as TEA is used, the amine in a liquid state is vaporized by a vaporization system such as a vaporizer or a bubbler, and then is supplied as an amine-based gas (TEA gas).

Also, through the gas supply pipe 232b, as a reactive gas having a different chemical structure (molecular structure) from the source gas, for example, a borazine-based gas, which is a first boron (B)-containing gas, is supplied into the process chamber 201 through the MFC 241b, the valve 243b, the nozzle 249b and the buffer chamber 237.

As the borazine-based gas, for example, a gas including a borazine ring structure and an organic ligand, that is, an organic borazine-based gas, may be used. As the organic borazine-based gas, for example, a gas that is obtained by vaporizing an alkylborazine compound, which is an organic borazine compound, may be used. The organic borazine-based gas may also be called a borazine compound gas.

Figure 9A:
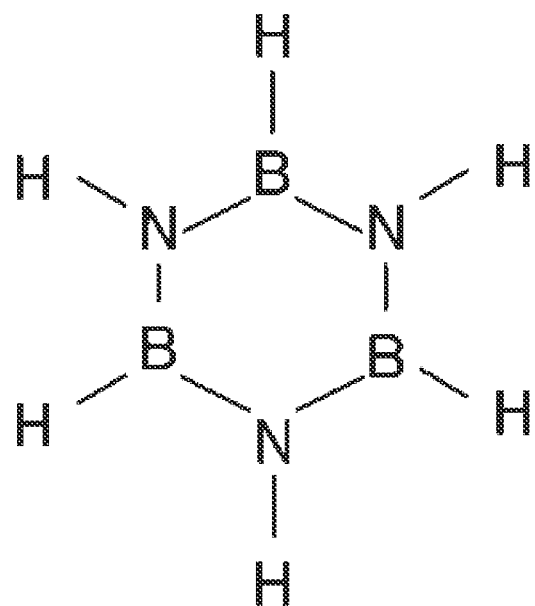
FIG. 9a shows a chemical structural formula of borazine.
Figure 9B:
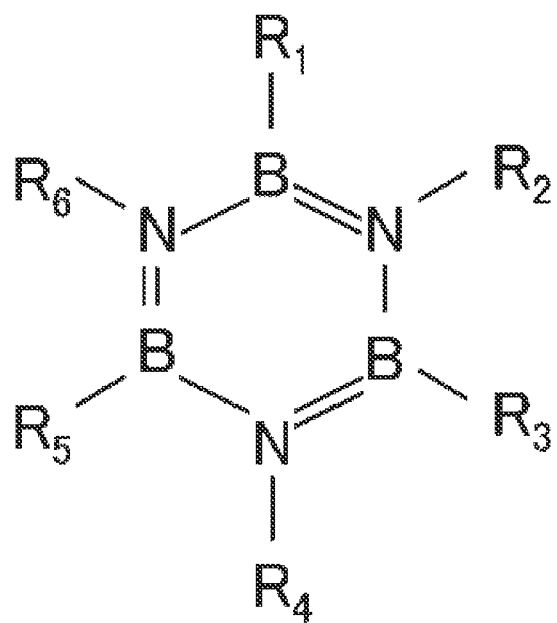
FIG. 9b shows a chemical structural formula of a borazine compound.

Here, the borazine is a heterocyclic compound formed of three elements, boron, nitrogen and hydrogen, and may be represented by the composition formula $B_3H_6N_3$ and a chemical structural formula thereof is shown in FIG. 9a. The borazine compound is a compound that has a borazine ring structure (also called a borazine structure) forming a borazine ring of three boron atoms and three nitrogen atoms. The organic borazine compound is a borazine compound containing carbon (C) and may also be called a borazine compound including a carbon-containing ligand, that is, an organic ligand. The alkylborazine compound is a borazine compound including an alkyl group, and may also be called a borazine compound including an alkyl group as an organic ligand. In the alkylborazine compound, at least any of six hydrogen atoms included in borazine is replaced with a hydrocarbon containing at least one carbon atom, and a chemical structural formula thereof is shown in FIG. 9b. Here, in the chemical structural formula shown in FIG. 9b, $R_1$ through $R_6$ refer to hydrogen or an alkyl group containing one to four carbon atoms. $R_1$ through $R_6$ may be alkyl groups of the same type or different types. However, a case in which all of $R_1$ through $R_6$ are hydrogen is excluded. The alkylborazine compound may be a material that has a borazine ring structure forming a borazine ring and contains boron, nitrogen, hydrogen and carbon. The alkylborazine compound may also be called a material that has a borazine ring structure and includes an alkyl ligand. Also, $R_1$ through $R_6$ may refer to hydrogen or an alkenyl group or an alkynyl group containing one to four carbon atoms. $R_1$ through $R_6$ may be alkenyl groups of the same type or different types and may be alkynyl groups of the same type or different types. However, a case in which all of $R_1$ through $R_6$ are hydrogen is excluded.

The borazine-based gas serves as a boron source, a nitrogen source and a carbon source in the substrate processing process to be described below.

Figure 9C:
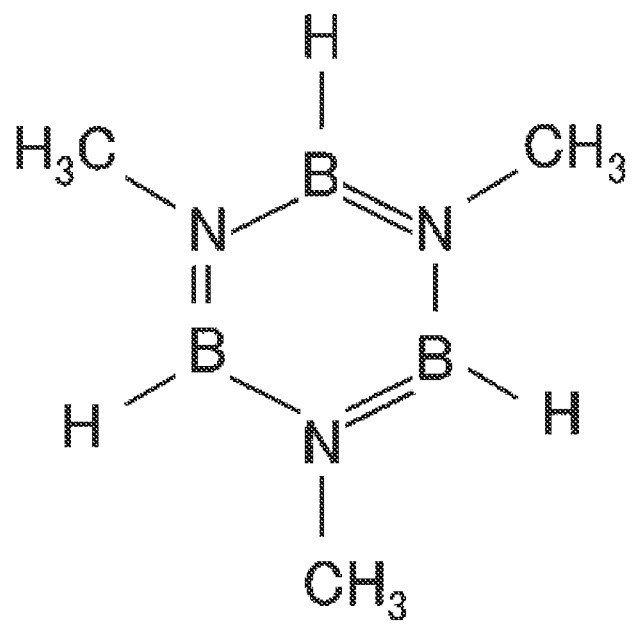
FIG. 9c shows a chemical structural formula of TMB.
Figure 9D:
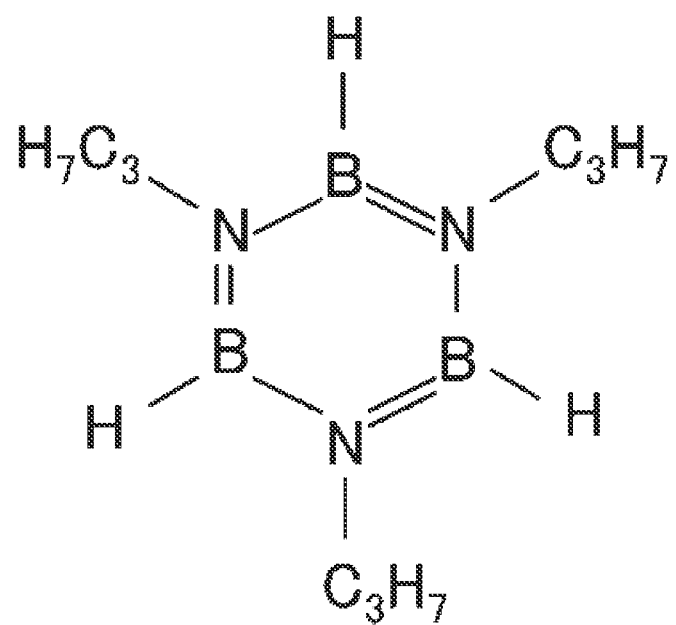
FIG. 9d shows a chemical structural formula of TPB.

As the borazine-based gas, for example, n,n',n"-trimethylborazine (abbreviation: TMB) gas, n,n',n"-triethylborazine (abbreviation: TEB) gas, n,n',n"-tri-n-propylborazine (abbreviation: TPB) gas, n,n',n"-triisopropylborazine (abbreviation: TIPB) gas, n,n',n"-tri-n-butylborazine (abbreviation: TBB) gas or n,n',n"-triisobutylborazine (abbreviation: TIBB) gas may be used. TMB has the chemical structural formula shown in FIG. 9b, wherein $R_1$, $R_3$ and $R_5$ are hydrogen and $R_2$, $R_4$ and $R_6$ are methyl groups, and is a borazine compound that may be represented by the chemical structural formula shown in FIG. 9c. TEB is a borazine compound, wherein $R_1$, $R_3$ and $R_5$ are hydrogen and $R_2$, $R_4$ and $R_6$ are ethyl groups in the chemical structural formula shown in FIG. 9b. TPB has the chemical structural formula shown in FIG. 9b, wherein $R_1$, $R_3$ and $R_5$ are hydrogen and $R_2$, $R_4$ and $R_6$ are propyl groups, and is a borazine compound that may be represented by the chemical structural formula shown in FIG. 9d. TIPB is a borazine compound, wherein $R_1$, $R_3$ and $R_5$ are hydrogen and $R_2$, $R_4$ and $R_6$ are isopropyl groups in the chemical structural formula shown in FIG. 9b. TBB is a borazine compound, wherein $R_1$, $R_3$ and $R_5$ are hydrogen and $R_2$, $R_4$ and $R_6$ are butyl groups in the chemical structural formula shown in FIG. 9b. TIBB is a borazine compound, wherein $R_1$, $R_3$ and $R_5$ are hydrogen and $R_2$, $R_4$ and $R_6$ are isobutyl groups in the chemical structural formula shown in FIG. 9b.

When a borazine compound in a liquid state under room temperature and normal pressure such as TMB is used, the borazine compound in a liquid state is vaporized by a vaporization system such as a vaporizer or a bubbler, and then is supplied as the borazine-based gas (such as TMB gas).

Also, through the gas supply pipe 232b, as a reactive gas having a different chemical structure from the source gas, for example, a boron-containing gas being free of a borazine ring structure, which is a second boron (B)-containing gas, is supplied into the process chamber 201 through the MFC 241b, the valve 243b, the nozzle 249b and the buffer chamber 237. As the boron-containing gas being free of a borazine ring structure, for example, a borane-based gas may be used.

The borane-based gas refers to a borane compound in a gas state, for example, a gas that is obtained by vaporizing a borane compound that is in a liquid state under room temperature and normal pressure, a borane compound that is in a gas state under room temperature and normal pressure or the like. The borane compound includes a haloborane compound containing boron and a halogen element, for example, a chloroborane compound containing boron and chlorine. Also, the borane compound includes a borane (borane hydrogen) such as monoborane ($BH_3$) or diborane ($B_2H_6$), or a borane compound (borane derivatives) in which hydrogen of the borane is replaced with another element or the like. The borane-based gas serves as a boron source in the substrate processing process to be described below. As the borane-based gas, for example, trichloroborane ($BCl_3$) gas may be used. $BCl_3$ gas is a boron-containing gas without the borazine compound, that is, a non-borazine based gas containing boron.

Through the gas supply pipes 232c and 232d, as the inert gas, for example, nitrogen (N$_2$) gas is supplied into the process chamber 201 through the MFCs 241c and 241d, the valves 243c and 243d, the gas supply pipes 232a and 232b, the nozzles 249a and 249b and the buffer chamber 237.

When the source gas is supplied through the gas supply pipe 232a, a source gas supply system mainly includes the gas supply pipe 232a, the MFC 241a and the valve 243a. The nozzle 249a may be included in the source gas supply system. The source gas supply system may also be called a source supply system. When the halosilane source gas is supplied through the gas supply pipe 232a, the source gas supply system may also be called a halosilane source gas supply system or a halosilane source supply system.

When the oxygen-containing gas is supplied through the gas supply pipe 232b, an oxygen-containing gas supply system mainly includes the gas supply pipe 232b, the MFC 241b and the valve 243b. The nozzle 249b and the buffer chamber 237 may be included in the oxygen-containing gas supply system. The oxygen-containing gas supply system may be called an oxidation gas supply system or an oxidant supply system.

When the carbon-containing gas is supplied through the gas supply pipe 232b, a carbon-containing gas supply system mainly includes the gas supply pipe 232b, the MFC 241b and the valve 243b. The nozzle 249b and the buffer chamber 237 may be included in the carbon-containing gas supply system. When the hydrocarbon-based gas is supplied through the gas supply pipe 232b, the carbon-containing gas supply system may be called a hydrocarbon-based gas supply system or a hydrocarbon supply system.

When the nitrogen-containing gas is supplied through the gas supply pipe 232b, a nitrogen-containing gas supply system mainly includes the gas supply pipe 232b, the MFC 241b and the valve 243b. The nozzle 249b and the buffer chamber 237 may be included in the nitrogen-containing gas supply system. The nitrogen-containing gas supply system may be called a nitriding gas supply system or a nitriding agent supply system. When the hydronitrogen-based gas is supplied through the gas supply pipe 232b, the nitrogen-containing gas supply system may be called a hydronitrogen-based gas supply system or a hydronitrogen supply system.

When a gas containing nitrogen and carbon is supplied through the gas supply pipe 232b, a nitrogen- and carbon-containing gas supply system mainly includes the gas supply pipe 232b, the MFC 241b and the valve 243b. The nozzle 249b and the buffer chamber 237 may be included in the nitrogen- and carbon-containing gas supply system. When the amine-based gas is supplied through the gas supply pipe 232b, the nitrogen- and carbon-containing gas supply system may be called an amine-based gas supply system or an amine supply system. Since the gas containing nitrogen and carbon is a nitrogen-containing gas and a carbon-containing gas, the nitrogen- and carbon-containing gas supply system may be included in the nitrogen-containing gas supply system and the carbon-containing gas supply system.

When the first boron-containing gas is supplied through the gas supply pipe 232b, a first boron-containing gas supply system mainly includes the gas supply pipe 232b, the MFC 241b and the valve 243b. The nozzle 249b and the buffer chamber 237 may be included in the first boron-containing gas supply system. When the borazine-based gas is supplied through the gas supply pipe 232b as the first boron-containing gas, the first boron-containing gas supply system may be called a borazine-based gas supply system, an organic borazine-based gas supply system or a borazine compound supply system. Since the borazine-based gas is a gas containing nitrogen and carbon and is a nitrogen-containing gas and a carbon-containing gas, the borazine-based gas supply system may be included in the nitrogen-containing gas supply system and the carbon-containing gas supply system.

When the second boron-containing gas is supplied through the gas supply pipe 232b, a second boron-containing gas supply system mainly includes the gas supply pipe 232b, the MFC 241b and the valve 243b. The nozzle 249b and the buffer chamber 237 may be included in the second boron-containing gas supply system. When the borane-based gas is supplied through the gas supply pipe 232b as the second boron-containing gas, the second boron-containing gas supply system may be called a borane-based gas supply system or a borane compound supply system.

The above-described source gas supply system may be called a first gas supply system. Also, any or all of the above-described oxygen-containing gas supply system, carbon-containing gas supply system, nitrogen-containing gas supply system and nitrogen- and carbon-containing gas supply system may be called a second gas supply system. Also, either or both of the above-described first boron-containing gas supply system and second boron-containing gas supply system may be called a third gas supply system. Also, either or both of the second gas supply system and the third gas supply system may be called a reactive gas supply system or a reactant supply system.

Also, an inert gas supply system mainly includes the gas supply pipes 232c and 232d, the MFCs 241c and 241d and the valves 243c and 243d. The inert gas supply system may be called a purge gas supply system, a dilution gas supply system or a carrier gas supply system.

Figure 2:
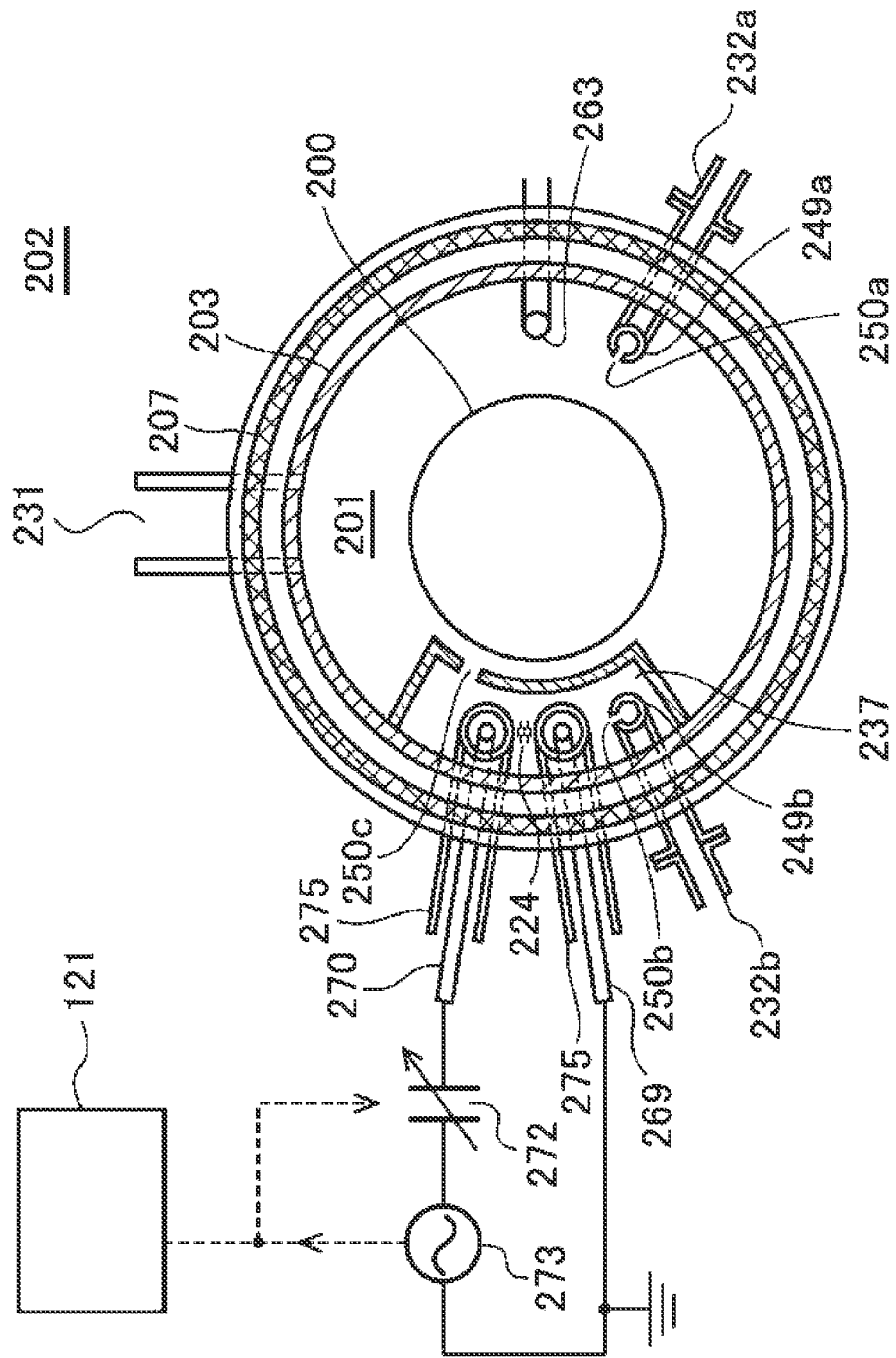
FIG. 2 is a schematic configuration diagram of a vertical processing furnace of a substrate processing apparatus preferably used in an embodiment of the present invention and is a cross-sectional view of a processing furnace portion taken along line A-A in FIG. 1.

As illustrated in FIG. 2, in the buffer chamber 237, two rod-shaped electrodes 269 and 270 made of a conductor and having an elongated structure are provided from the lower part to the upper part of the reaction tube 203 in the direction in which the wafers 200 are stacked. Each of the rod-shaped electrodes 269 and 270 is provided in parallel to the nozzle 249b. Each of the rod-shaped electrodes 269 and 270 is protected by being covered with an electrode protecting pipe 275 from an upper part to a lower part. One of the rod-shaped electrodes 269 and 270 is connected to a high frequency power source 273 through a matching unit 272, and the other thereof is connected to a ground serving as a reference potential. When high frequency (RF) power is applied between the rod-shaped electrodes 269 and 270 from the high frequency power source 273 through the matching unit 272, plasma is generated in a plasma generation region 224 between the rod-shaped electrodes 269 and 270. A plasma source serving as a plasma generator (plasma generating unit) mainly includes the rod-shaped electrodes 269 and 270, and the electrode protecting pipe 275. The matching unit 272 and the high frequency power source 273 may be included in the plasma source. As will be described below, the plasma source also serves as an exciting unit (activating device) configured to excite (activate) a gas to plasma, that is, excite a gas to a plasma state.

The electrode protecting pipe 275 has a structure that can be inserted into the buffer chamber 237 while each of the rod-shaped electrodes 269 and 270 is isolated from an atmosphere in the buffer chamber 237. When a concentration of oxygen in the electrode protecting pipe 275 is the same as a concentration of oxygen in the external air (atmosphere), the rod-shaped electrodes 269 and 270 inserted into the electrode protecting pipe 275 are oxidized by heat from the heater 207. When the inert gas such as N$_2$ gas is filled in the electrode protecting pipe 275, or when an inside of the electrode protecting pipe 275 is purged with the inert gas such as $N_2$ gas using an inert gas purge mechanism, a concentration of oxygen in the electrode protecting pipe 275 decreases, thereby preventing the rod-shaped electrodes 269 and 270 from being oxidized.

The exhaust pipe 231 configured to exhaust an atmosphere in the process chamber 201 is provided in the reaction tube 203. In the exhaust pipe 231, a vacuum pump 246 serving as a vacuum-exhaust device is connected through a pressure sensor 245 serving as a pressure detector (pressure detecting unit) configured to detect a pressure in the process chamber 201 and an auto pressure controller (APC) valve 244 serving as a pressure regulator (pressure regulating unit). The APC valve 244 is a valve that may perform vacuum-exhaust and vacuum-exhaust stop in the process chamber 201 by opening or closing the valve while the vacuum pump 246 is operated, and regulate a pressure in the process chamber 201 by adjusting a degree of valve opening based on information on pressure detected by the pressure sensor 245 while the vacuum pump 246 is operated. An exhaust system mainly includes the exhaust pipe 231, the APC valve 244 and the pressure sensor 245. The vacuum pump 246 may be included in the exhaust system.

Below the reaction tube 203, a seal cap 219 capable of hermetically sealing a lower opening of the reaction tube 203 is provided as a furnace port cover. The seal cap 219 is configured to abut a lower end of the reaction tube 203 in a vertical direction from a lower part thereof. The seal cap 219 is made of a metal such as SUS and has a disk shape. An O ring 220 is provided as a seal member that abuts the lower end of the reaction tube 203 on an upper surface of the seal cap 219. A rotating mechanism 267 configured to rotate the boat 217, to be described below, is provided at a side opposite to the process chamber 201 of the seal cap 219. A rotary shaft 255 of the rotating mechanism 267 penetrates the seal cap 219 and is connected to the boat 217. The rotating mechanism 267 is configured to rotate the wafer 200 by rotating the boat 217. The seal cap 219 is configured to be vertically moved upward and downward by a boat elevator 115 serving as a lifting mechanism that is vertically provided at the outside of the reaction tube 203. The boat elevator 115 is configured to load or unload the boat 217 into or from the process chamber 201 by moving the seal cap 219 upward and downward. That is, the boat elevator 115 is configured as a transfer device (transfer mechanism) that transfers the boat 217, that is, the wafer 200, into or out of the process chamber 201.

The boat 217 serving as a substrate support is configured to support the plurality of wafers 200 on multiple stages, for example, 25 to 200 wafers 200, that are vertically arranged in a horizontal orientation while centers thereof are aligned, that is, to support the wafers arranged at intervals. The boat 217 is made of a heat-resistant material such as quartz or SiC. Below the boat 217, an insulation plate 218 made of a heat-resistant material such as quartz or SiC is supported in a horizontal orientation on multiple stages. According to such a configuration, heat from the heater 207 is not hindered from being transferred to the seal cap 219. However, the present embodiment is not limited to the above-described form. For example, no insulation plate 218 is provided below the boat 217, and an insulation tube configured as a tubular member made of a heat-resistant material such as quartz or SiC may be provided.

A temperature sensor 263 serving as a temperature detector is provided in the reaction tube 203. By regulating power supply to the heater 207 based on information on the temperature detected by the temperature sensor 263, the temperature in the process chamber 201 is set to have a desired temperature distribution. Similarly to the nozzles 249a and 249b, the temperature sensor 263 is configured as an L shape, and is provided along the inner wall of the reaction tube 203.

Figure 3:
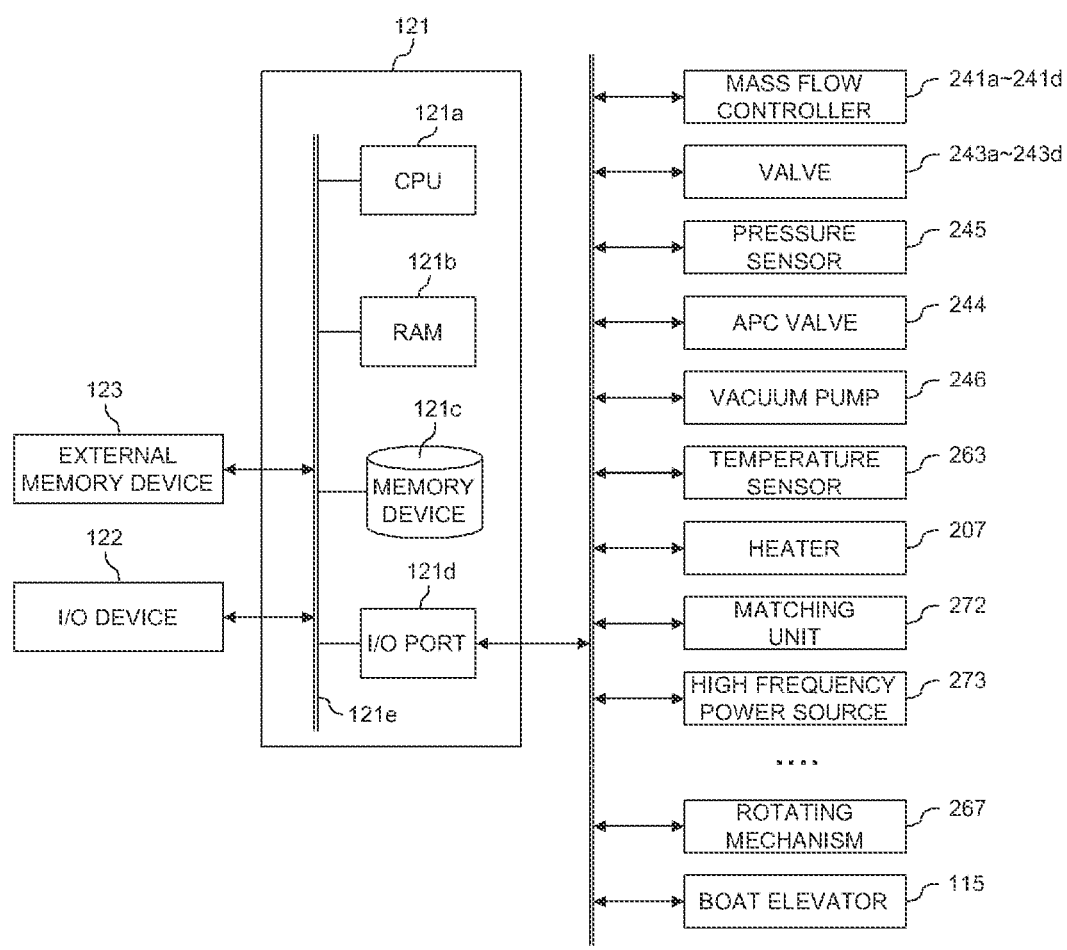
FIG. 3 is a schematic configuration diagram of a controller of a substrate processing apparatus preferably used in an embodiment of the present invention and is a block diagram illustrating a control system of the controller.

As illustrated in FIG. 3, a controller 121 serving as a control unit (control device) is configured as a computer that includes a central processing unit (CPU) 121a, a random access memory (RAM) 121b, a memory device 121c and an I/O port 121d. The RAM 121b, the memory device 121c and the I/O port 121d are configured to exchange data with the CPU 121a through an internal bus 121e. An I/O device 122 configured as, for example, a touch panel, is connected to the controller 121.

The memory device 121c is configured as, for example, a flash memory and a hard disk drive (HDD). A control program controlling operations of the substrate processing apparatus, a process recipe describing sequences or conditions of substrate processing (to be described below) and the like are readably stored in the memory device 121c. The process recipe, which is a combination of sequences, causes the controller 121 to execute each sequence in the substrate processing process to be described below in order to obtain a predetermined result, and functions as a program. Hereinafter, such a process recipe, a control program and the like are collectively simply called a "program." When the term "program" is used in this specification, it may refer to either or both of the process recipe and the control program. The RAM 121b is configured as a memory area (work area) in which a program, data and the like read by the CPU 121a are temporarily stored.

The I/O port 121d is connected to the MFCs 241a through 241d, the valves 243a through 243d, the pressure sensor 245, the APC valve 244, the vacuum pump 246, the heater 207, the temperature sensor 263, the high frequency power source 273, the matching unit 272, the rotating mechanism 267, the boat elevator 115 and the like.

The CPU 121a reads and executes the control program from the memory device 121c and reads the process recipe from the memory device 121c according to an input of a manipulating command from the I/O device 122. To comply with the content of the read process recipe, the CPU 121a is configured to control a flow rate regulating operation of various types of gases by the MFCs 241a through 241d, an on-off operation of the valves 243a through 243d, an on-off operation of the APC valve 244, a pressure regulating operation by the APC valve 244 based on the pressure sensor 245, starting and stopping of the vacuum pump 246, a temperature regulating operation by the heater 207 based on the temperature sensor 263, power supply of the high frequency power source 273, an impedance regulating operation by the matching unit 272, a rotation and rotational speed regulating operation of the boat 217 by the rotating mechanism 267, a lifting operation of the boat 217 by the boat elevator 115 and the like.

The controller 121 is not limited to being configured as a dedicated computer but may be configured as a general-purpose computer. For example, the controller 121 according to the present embodiment may be configured by preparing an external memory device 123 [for example, a magnetic tape, a magnetic disk such as a flexible disk or a hard disk, an optical disc such as a compact disc (CD) or a digital video disc (DVD), a magneto-optical disc such as an MO and a semiconductor memory such as a Universal Serial Bus (USB) memory or a memory card] recording the above program, and then installing the program in the general-purpose computer using the external memory device 123.

However, a method of supplying the program to the computer is not limited to using the external memory device 123. For example, a communication line such as the Internet or an exclusive line may be used to supply the program without using the external memory device. The memory device 121c or the external memory device 123 is configured as a non-transitory computer-readable recording medium. Hereinafter, these are also collectively simply called a recording medium. When the term "recording medium" is used in this specification, it refers to either or both of the memory device 121c and the external memory device 123.

(2) Substrate Processing Process

As a process among manufacturing processes of a semiconductor apparatus (semiconductor device) using the above-described substrate processing apparatus, an exemplary sequence of forming a film on a substrate will be described with reference to FIG. 4. In the following description, operations of respective units constituting the substrate processing apparatus are controlled by the controller 121.

Figure 4:
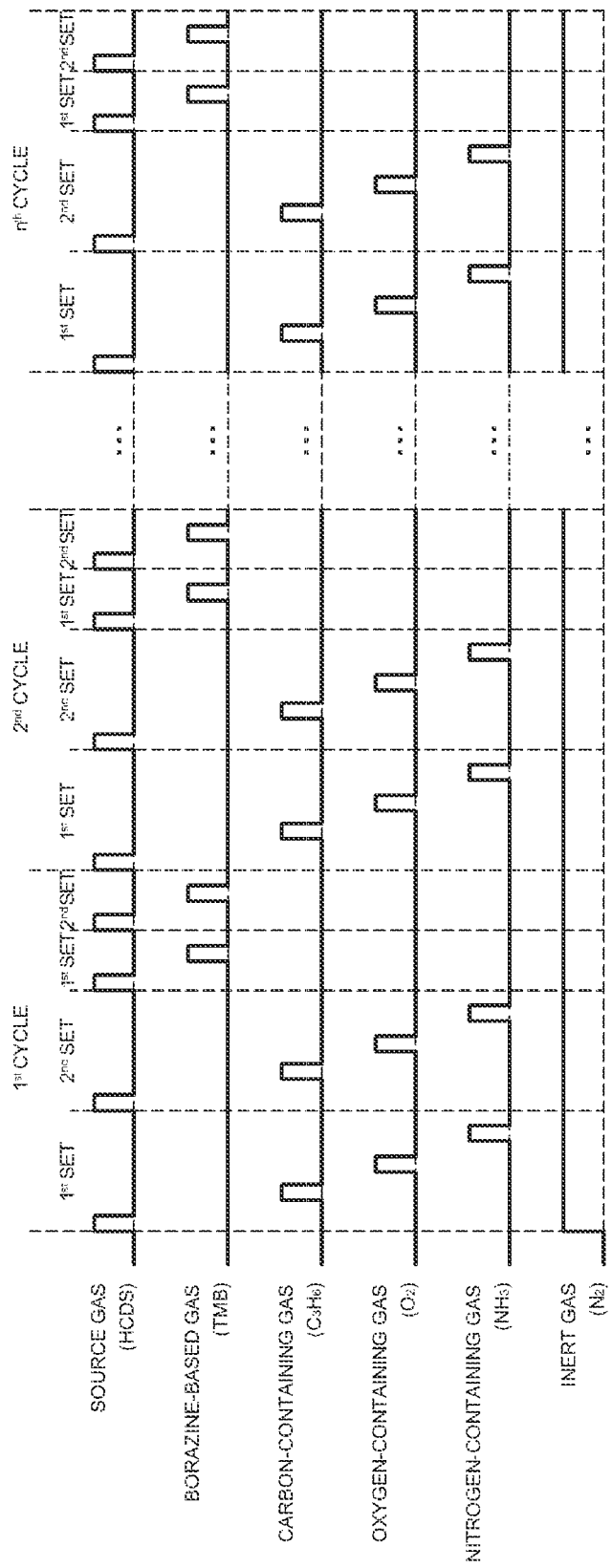
FIG. 4 is a diagram illustrating a gas supply timing in a film formation sequence of an embodiment of the present invention.

In a film formation sequence illustrated in FIG. 4, a silicon boronoxycarbonitride film (SiBOCN film) having a borazine ring structure is formed as a laminate film in which a first film and a second film are laminated on the wafer 200 serving as the substrate by performing a cycle a predetermined number of times (n times). The cycle includes a step of forming the first film being free of a borazine ring structure and contains silicon as at least a predetermined element and at least one element selected from the group consisting of oxygen, carbon and nitrogen; and a step of forming the second film containing at least boron and nitrogen and having a borazine ring structure. Also, the SiBOCN film, that is, the laminate film, may be called a silicon oxycarbonitride (SiOCN film) containing boron, a SiOCN film doped with boron or a boron-containing SiOCN film. Also, the SiBOCN film having a borazine ring structure, that is, the laminate film, may be called a SiOCN film including a borazine ring, a SiOCN film doped with a borazine ring or a SiOCN film having a borazine ring.

Here, in the step of forming the first film, the SiOCN film is formed as the first film by performing a first set a predetermined number of times ($m_1$ times). The first set includes Step 1 in which HCDS gas is supplied to the wafer 200 as a source gas containing silicon, Step 2 in which $C_3H_6$ gas is supplied to the wafer 200 as a carbon-containing gas, Step 3 in which $O_2$ gas is supplied to the wafer 200 as an oxygen-containing gas and Step 4 in which $NH_3$ gas is supplied to the wafer 200 as a nitrogen-containing gas, and these steps are performed non-simultaneously, that is, asynchronously.

Also, in the step of forming the second film, a siliconboroncarbonitride film (SiBCN film) having a borazine ring structure is formed as the second film by performing a second set a predetermined number of times ($m_2$ times). The second set includes Step 5 in which HCDS gas is supplied to the wafer 200 as a source gas containing silicon and Step 6 in which TMB gas is supplied to the wafer 200 as the borazine-based gas and these steps are performed non-simultaneously, that is, asynchronously.

Here, when it is described that "the first set, the second set or the cycle is performed a predetermined number of times," it means that these sets or the cycle is performed once or a plurality of times. That is, it means that these sets or the cycle is performed once or more. FIG. 4 illustrates an example in which the first set and the second set each are performed twice, and the above-described cycle is repeated n times.

In this specification, the above-described film formation sequence may be represented as follows for convenience of description.

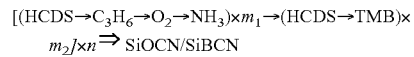

When the term "wafer" is used in this specification, it refers to "the wafer itself," or a "laminate (aggregate) of a wafer, a predetermined layer, film and the like formed on a surface thereof," that is, the wafer refers to a wafer including a predetermined layer, film and the like formed on a surface thereof. In addition, when the term "surface of the wafer" is used in this specification, it refers to "a surface (exposed surface) of the wafer itself" or "a surface of a predetermined layer, film and the like formed on the wafer, that is, the outermost surface of the wafer as the laminate."

Therefore, when it is described in this specification that "a predetermined gas is supplied to the wafer," it means that "a predetermined gas is directly supplied to a surface (exposed surface) of the wafer itself" or "a predetermined gas is supplied to a layer, film and the like formed on the wafer, that is, to the outermost surface of the wafer as the laminate." In addition, when it is described in this specification that "a predetermined layer (or film) is formed on the wafer," it means that "a predetermined layer (or film) is directly formed on a surface (exposed surface) of the wafer itself" or "a predetermined layer (or film) is formed on a layer, film and the like formed on the wafer, that is, a predetermined layer (or film) is formed on the outermost surface of the wafer as the laminate."

The terms "substrate" and "wafer" as used in this specification have the same meanings. Thus, the term "wafer" in the above description may be replaced with the term "substrate."

(Wafer Charging and Boat Loading)

The plurality of wafers 200 are loaded on the boat 217 (wafer charging). Then, as illustrated in FIG. 1, the boat 217 supporting the plurality of wafers 200 is lifted by the boat elevator 115 and is loaded into the process chamber 201 (boat loading). In this state, the lower end of the reaction tube 203 is sealed by the seal cap 219 through the O ring 220.

(Pressure Regulation and Temperature Regulation)

Vacuum-exhaust (exhaust in a reduced pressure) is performed by the vacuum pump 246 such that a pressure in the process chamber 201, that is, a pressure in a space in which the wafer 200 is present, is a desired pressure (degree of vacuum). In this case, the pressure in the process chamber 201 is measured by the pressure sensor 245, and the APC valve 244 is feedback-controlled based on information on the measured pressure. The vacuum pump 246 is continuously operated at least until processing on the wafer 200 is completed. Also, the wafer 200 in the process chamber 201 is heated to a desired temperature by the heater 207. In this case, based on information on the temperature detected by the temperature sensor 263, power supply to the heater 207 is feedback-controlled such that an inside of the process chamber 201 has a desired temperature distribution. The heating of the inside of the process chamber 201 by the heater 207 is continuously performed at least until processing on the wafer 200 is completed. Also, the rotating mechanism 267 begins to rotate the boat 217 and the wafer 200. The rotation of the boat 217 and the wafer 200 by the rotating mechanism 267 is continuously performed at least until processing on the wafer 200 is completed.

(Step of Forming First Film)

Then, the following four steps, that is, Steps 1 through 4, are sequentially performed.

[Step 1]

(HCDS Gas Supply)

In this step, HCDS gas is supplied to the wafer 200 in the process chamber 201.

The valve 243a is opened to flow HCDS gas into the gas supply pipe 232a. HCDS gas whose flow rate is regulated by the MFC 241a is supplied into the process chamber 201 through the nozzle 249a and exhausted through the exhaust pipe 231. In this case, HCDS gas is supplied to the wafer 200. In this case, at the same time, the valve 243c is opened to flow $N_2$ gas into the gas supply pipe 232c. $N_2$ gas whose flow rate is regulated by the MFC 241c is supplied into the process chamber 201 along with HCDS gas and exhausted through the exhaust pipe 231.

Also, in order to prevent HCDS gas from being introduced into the nozzle 249b, the valve 243d is opened to flow $N_2$ gas into the gas supply pipe 232d. $N_2$ gas is supplied into the process chamber 201 through the gas supply pipe 232b, the nozzle 249b and the buffer chamber 237 and exhausted through the exhaust pipe 231.

A supply flow rate of HCDS gas controlled by the MFC 241a is set to, for example, a flow rate in a range of 1 sccm through 2,000 sccm, and preferably 10 sccm through 1,000 sccm. A supply flow rate of $N_2$ gas controlled by the MFCs 241c and 241d is set to, for example, a flow rate in a range of 100 sccm through 10,000 sccm. A pressure in the process chamber 201 is set to, for example, a pressure in a range of 1 Pa through 2,666 Pa, and preferably 67 Pa through 1,333 Pa. A time for which HCDS gas is supplied to the wafer 200, that is, a gas supply time [radiation time], is set to, for example, a time in a range of 1 second through 120 seconds, and preferably 1 second through 60 seconds. A temperature of the heater 207 is set such that a temperature of the wafer 200 is set to, for example, a temperature in a range of 250° C. to 700° C., preferably 300° C. to 650° C., and more preferably 350° C. to 600° C.

When the temperature of the wafer 200 is less than 250° C., since it is difficult for HCDS to be chemically adsorbed onto the wafer 200, it is difficult to obtain a practical film formation rate in some cases. When the temperature of the wafer 200 is set through 250° C. or more, it is possible to address this problem. When the temperature of the wafer 200 is set through 300° C. or more and 350° C. or more, it is possible for HCDS to be more sufficiently adsorbed onto the wafer 200, thereby obtaining a more sufficient film formation rate.

When the temperature of the wafer 200 is greater than 700° C., a CVD reaction becomes strong [a gas-phase reaction is dominant], film thickness uniformity is likely to be degraded and control thereof becomes difficult. When the temperature of the wafer 200 is set through 700° C. or less, it is possible to cause an appropriate gas-phase reaction. Accordingly, it is possible to suppress degradation of film thickness uniformity and thus control thereof is possible. In particular, when the temperature of the wafer 200 is set through 650° C. or less and 600° C. or less, a surface reaction becomes more dominant than a gas-phase reaction, film thickness uniformity is ensured, and control thereof is facilitated.

Therefore, the temperature of the wafer 200 is preferably set to a temperature in a range of 250° C. to 700° C., preferably 300° C. to 650° C., and more preferably 350° C. to 600° C.

When HCDS gas is supplied to the wafer 200 under the above-described conditions, a silicon-containing layer that contains chlorine and has a thickness of, for example, one atomic layer to several atomic layers, is formed on the outermost surface of the wafer 200 as a first layer. The silicon-containing layer containing chlorine may include either or both of a silicon layer containing chlorine and an adsorption layer of HCDS.

The silicon layer containing chlorine generally refers to a continuous layer that is formed of silicon and contains chlorine, a discontinuous layer or a silicon thin film that is formed by overlapping these layers and contains chlorine. The continuous layer that is formed of silicon and contains chlorine may also be called a silicon thin film containing chlorine. Silicon forming the silicon layer containing chlorine includes silicon whose bonds with chlorine are not completely broken and silicon whose bonds with chlorine are completely broken.

The adsorption layer of HCDS includes a continuous adsorption layer formed of HCDS molecules and a discontinuous adsorption layer. That is, the adsorption layer of HCDS includes an adsorption layer that is formed of HCDS molecules and has a thickness of one molecular layer or less than one molecular layer. HCDS molecules forming the adsorption layer of HCDS include molecules in which some S—Cl bonds are partially broken. That is, the adsorption layer of HCDS may include either or both of a physical adsorption layer of HCDS and a chemical adsorption layer of HCDS.

Here, "layer having a thickness of less than one atomic layer" refers to a discontinuously formed atomic layer. "Layer having a thickness of one atomic layer" refers to a continuously formed atomic layer. "Layer having a thickness of less than one molecular layer" refers to a discontinuously formed molecular layer. "Layer having a thickness of one molecular layer" refers to a continuously formed molecular layer. The silicon-containing layer containing chlorine may include both of the silicon layer containing chlorine and the adsorption layer of HCDS. However, as described above, the silicon-containing layer containing chlorine is represented using an expression such as "one atomic layer" or "several atomic layers."

Under conditions in which HCDS gas is self-decomposed (pyrolyzed), that is, conditions causing a pyrolysis reaction of HCDS gas, when silicon is deposited on the wafer 200, the silicon layer containing chlorine is formed. Under conditions in which HCDS gas is not self-decomposed (pyrolyzed), that is, conditions that do not cause a pyrolysis reaction of HCDS gas, when HCDS is adsorbed onto the wafer 200, the adsorption layer of HCDS is formed. Forming the silicon layer containing chlorine on the wafer 200 is preferable since a film formation rate is higher when the silicon layer containing chlorine is formed on the wafer 200 than when the adsorption layer of HCDS is formed on the wafer 200.

When a thickness of the first layer is greater than several atomic layers, a modification action in Steps 3 and 4 to be described below does not influence the entire first layer. Also, a minimum thickness of the first layer is less than one atomic layer. Therefore, the thickness of the first layer is preferably set to one atomic layer to several atomic layers. When the thickness of the first layer is set to one atomic layer or less, that is, one atomic layer or less than one atomic layer, since actions of a modification reaction in Steps 3 and 4 to be described below can relatively increase, it is possible to reduce a time required for the modification reaction in Steps 3 and 4. A time required for forming the first layer in Step 1 can also be reduced. As a result, it is possible to reduce a processing time for one cycle, and a total processing time can be reduced. That is, it is possible to increase the film formation rate. Also, when the thickness of the first layer is set to one atomic layer or less, it is possible to increase controllability of film thickness uniformity.

(Residual Gas Removal)

After the first layer is formed, the valve 243a is closed to stop supply of HCDS gas. In this case, while the APC valve 244 is opened, the inside of the process chamber 201 is vacuum-exhausted by the vacuum pump 246, and an unreacted gas remaining in the process chamber 201 or HCDS gas that has contributed to formation of the first layer is removed from the inside of the process chamber 201. In this case, while the valves 243c and 243d are opened, supply of $N_2$ gas into the process chamber 201 continues. $N_2$ gas serves as a purge gas. Therefore, it is possible to increase an effect of removing a gas remaining in the process chamber 201 from the inside of the process chamber 201.

In this case, a gas remaining in the process chamber 201 may not be completely removed and the inside of the process chamber 201 may not be completely purged. When an amount of the gas remaining in the process chamber 201 is small, there is no negative influence on Step 2 performed thereafter. There is no need to set a flow rate of $N_2$ gas supplied into the process chamber 201 to be high. For example, when the same amount of $N_2$ gas as a volume of the reaction tube 203 [the process chamber 201] is supplied, it is possible to purge to the extent that there is no negative influence on Step 2. In this manner, when the inside of the process chamber 201 is not completely purged, a purge time decreases, thereby improving throughput. It is possible to suppress unnecessary consumption of $N_2$ gas to a minimum.

As the source gas, in addition to HCDS gas, an inorganic halosilane source gas such as OCTS gas, dichlorosilane ($SiH_2Cl_2$, abbreviation: DCS) gas, monochlorosilane ($SiH_3Cl$, abbreviation: MCS) gas, tetrachlorosilane, that is, silicon tetrachloride ($SiCl_4$, abbreviation: STC) gas or trichlorosilane ($SiHCl_3$, abbreviation: TCS) gas may be used.

Also, as the source gas, an organic halosilane source gas such as BTCSE gas, BTCSM gas, TCDMDS gas, DCTMDS gas or MCPMDS gas may be used.

Also, as the source gas, an inorganic silane source gas being free of a halogen group such as monosilane ($SiH_4$, abbreviation: MS) gas, disilane ($Si_2H_6$, abbreviation: DS) gas or trisilane ($Si_3H_8$, abbreviation: TS) gas may be used.

Also, as the source gas, an organic silane source gas being free of a halogen group such as dimethylsilane ($SiC_2H_8$, abbreviation: DMS) gas, trimethylsilane ($SiC_3H_{10}$, abbreviation: TMS) gas, diethylsilane ($SiC_4H_{12}$, abbreviation: DES) gas or 1,4-disilabutane ($Si_2C_2H_{10}$, abbreviation: DSB) gas may be used.

Also, as the source gas, an amino-based (amine-based) silane source gas being free of a halogen group such as trisdimethylaminosilane ($Si[N(CH_3)_2]_3H$, abbreviation: 3DMAS) gas, tetrakisdimethylaminosilane ($Si[N(CH_3)_2]_4$, abbreviation: 4DMAS) gas, bisdiethylaminosilane ($Si[N(C_2H_5)_2]_2H_2$, abbreviation: BDEAS) gas or bis(tertiary-butylamino)silane ($SiH_2[NH(C_4H_9)]_2$, abbreviation: BTBAS) gas may be used.

Also, when the organic halosilane source gas or the organic silane source gas serving as a carbon source is used as the source gas, carbon can be contained in the first layer, and as a result, a concentration of carbon in the first film (the SiOCN film) formed on the wafer 200, that is, the finally formed laminate film (the SiBOCN film having a borazine ring structure), can be higher than when the inorganic halosilane source gas or the inorganic silane source gas is used as the source gas. Also, when the amino-based silane source gas serving as a carbon source and a nitrogen source is used as the source gas, both carbon and nitrogen can be contained in the first layer, and as a result, a concentration of carbon and a concentration of nitrogen in the first film formed on the wafer 200, that is, the finally formed laminate film, can be higher than when the inorganic silane source gas is used as the source gas.

As the inert gas, in addition to $N_2$ gas, rare gases such as Ar gas, He gas, Ne gas and Xe gas may be used.

β[Step 2]

($C_3H_6$ Gas Supply)

After Step 1 is completed, thermally activated $C_3H_6$ gas is supplied to the wafer 200 in the process chamber 201, that is, the first layer formed on the wafer 200.

In this step, on-off control of the valves 243b through 243d is performed according to the same sequence as on-off control of the valves 243a, 243c and 243d in Step 1. $C_3H_6$ gas whose flow rate is regulated by the MFC 241b is supplied into the process chamber 201 through the nozzle 249b and the buffer chamber 237 and exhausted through the exhaust pipe 231. In this case, $C_3H_6$ gas is supplied to the wafer 200.

A supply flow rate of $C_3H_6$ gas controlled by the MFC 241b is set to, for example, a flow rate in a range of 100 sccm through 10,000 sccm. A pressure in the process chamber 201 is set to, for example, a pressure in a range of 1 Pa through 5,000 Pa, and preferably 1 Pa through 4,000 Pa. A partial pressure of $C_3H_6$ gas in the process chamber 201 is set to, for example, a pressure in a range of 0.01 Pa through 4,950 Pa. When the pressure in the process chamber 201 is set to a relatively high pressure range in this manner, it is possible to thermally activate $C_3H_6$ gas to non-plasma. When $C_3H_6$ gas is thermally activated and then supplied, since a relatively soft reaction can be caused, the formation of a carbon-containing layer to be described below may be facilitated. A time for which $C_3H_6$ gas is supplied to the wafer 200, that is, a gas supply time (radiation time) is set to, for example, a time in a range of 1 second through 200 seconds, preferably 1 second through 120 seconds, and more preferably 1 second through 60 seconds. The other processing conditions may be the same as, for example, the processing conditions of Step 1.

In this case, a gas flowing in the process chamber 201 is thermally activated $C_3H_6$ gas, and no HCDS gas flows in the process chamber 201. Therefore, $C_3H_6$ gas does not cause a gas-phase reaction, and is supplied to the wafer 200 in an activated state. As a result, a layer containing carbon (carbon-containing layer) is formed on the first layer formed on the wafer 200 in Step 1, that is, on a surface of the silicon-containing layer containing chlorine. The carbon-containing layer may include either or both of a carbon layer and an adsorption layer of $C_3H_6$. The carbon-containing layer becomes a layer having a thickness of less than one molecular layer or less than one atomic layer, that is, a discontinuous layer. Accordingly, a second layer containing silicon, chlorine and carbon is formed on the outermost surface of the wafer 200. The second layer becomes a layer including the silicon-containing layer containing chlorine and the carbon-containing layer. Also, a part of the first layer reacts with $C_3H_6$ gas according to conditions, the first layer is modified (carbonized), and thus a SiC layer may be included in the second layer.

The carbon-containing layer needs to be set as a discontinuous layer. When the carbon-containing layer is set as a continuous layer, an entire surface of the silicon-containing layer containing chlorine is covered with the carbon-containing layer. In this case, no silicon is present in the surface of the second layer, and as a result, an oxidation reaction of the second layer in Step 3 to be described below or a nitridation reaction of a third layer in Step 4 to be described below may be difficult in some cases. This is because oxygen or nitrogen binds to silicon, but hardly bind to carbon under the above-described processing conditions. In order to cause a desired reaction in Step 3 or Step 4 to be described below, an adsorption state of the carbon-containing layer onto the silicon-containing layer containing chlorine needs to be an unsaturated state, and silicon needs to be exposed to a surface of the second layer. Also, when processing conditions of Step 2 are set as processing conditions within the above-described processing condition range, the carbon-containing layer can be the discontinuous layer.

(Residual Gas Removal)

After the second layer is formed, the valve 243b is closed to stop supply of $C_3H_6$ gas. Also, according to the same processing sequences as in Step 1, an unreacted gas remaining in the process chamber 201 or $C_3H_6$ gas that has contributed to formation of the carbon-containing layer or reaction by-products are removed from the inside of the process chamber 201. In this case, similarly to Step 1, the gas remaining in the process chamber 201 and the like may not be completely removed.

As the carbon-containing gas, in addition to $C_3H_6$ gas, a hydrocarbon-based gas such as acetylene ($C_2H_2$) gas or ethylene ($C_2H_4$) gas may be used. As the inert gas, in addition to $N_2$ gas, various types of rare gases exemplified in Step 1 may be used.

[Step 3]

($O_2$ Gas Supply)

After Step 2 is completed, thermally activated $O_2$ gas is supplied to the wafer 200 in the process chamber 201, that is, the second layer formed on the wafer 200.

In this step, on-off control of the valves 243b through 243d is performed according to the same sequence as on-off control of the valves 243a, 243c and 243d in Step 1. $O_2$ gas whose flow rate is regulated by the MFC 241b is supplied into the process chamber 201 through the nozzle 249b and the buffer chamber 237 and exhausted through the exhaust pipe 231. In this case, $O_2$ gas is supplied to the wafer 200.

A supply flow rate of $O_2$ gas controlled by the MFC 241b is set to, for example, a flow rate in a range of 100 sccm through 10,000 sccm. A pressure in the process chamber 201 is set to, for example, a pressure in a range of 1 Pa through 4,000 Pa, and preferably 1 Pa through 3,000 Pa. A partial pressure of $O_2$ gas in the process chamber 201 is set to, for example, a pressure in a range of 0.01 Pa through 3,960 Pa. When the pressure in the process chamber 201 is set to a relatively high pressure range in this manner, it is possible to thermally activate $O_2$ gas to non-plasma. When $O_2$ gas is thermally activated and then supplied, since a relatively soft reaction can be caused, oxidation to be described below can be softly performed. A time for which $O_2$ gas is supplied to the wafer 200, that is, a gas supply time (radiation time), is set to, for example, a time in a range of 1 second through 120 seconds, and preferably 1 second through 60 seconds. The other processing conditions are the same as, for example, the processing conditions of Step 1.

In this case, a gas flowing in the process chamber 201 is thermally activated $O_2$ gas, and neither HCDS gas nor $C_3H_6$ gas flows in the process chamber 201. Therefore, $O_2$ gas does not cause a gas-phase reaction and is supplied to the wafer 200 in an activated state. $O_2$ gas supplied to the wafer 200 reacts with at least a part of the second layer (a layer including the silicon-containing layer containing chlorine and the carbon-containing layer) that is formed on the wafer 200 in Step 2 and contains silicon, chlorine and carbon. Accordingly, the second layer is thermally oxidized to non-plasma and changed (modified) to a third layer containing silicon, oxygen and carbon, that is, a silicon oxycarbide layer (SiOC layer). Also, when the third layer is formed, impurities such as chlorine included in the second layer form a gaseous material including at least chlorine during the modification reaction due to $O_2$ gas and are discharged from the inside of the process chamber 201. That is, impurities such as chlorine in the second layer are extracted or desorbed from the second layer, and thus separated from the second layer. Therefore, the third layer becomes a layer having fewer impurities such as chlorine than the second layer.

In this case, the second layer is not saturated with the oxidation reaction. For example, when the silicon-containing layer containing chlorine having a thickness of several atomic layers is formed in Step 1 and the carbon-containing layer having a thickness of less than one atomic layer is formed in Step 2, at least a part of the surface layer (one atomic layer of the surface) is oxidized. In this case, oxidation is performed under a condition in which the second layer is not saturated with the oxidation reaction such that the entire second layer is not oxidized. Also, according to conditions, several layers below the surface layer of the second layer can be oxidized. However, it is preferable that only the surface layer be oxidized, since controllability of a composition ratio of the first film formed on the wafer 200, that is, the finally formed laminate film, can increase. Also, a part of the surface layer is similarly oxidized, for example, when the silicon-containing layer containing chlorine having a thickness of one atomic layer or less than one atomic layer is formed in Step 1, and the carbon-containing layer having a thickness of less than one atomic layer is formed in Step 2. In this case, oxidation is performed under a condition in which the second layer is not saturated with the oxidation reaction such that the entire second layer is not oxidized. Also, when processing conditions of Step 3 are set as processing conditions within the above-described range of processing conditions, the second layer may not be saturated with the oxidation reaction.

Meanwhile, in this case, the above-described processing conditions may be regulated such that, in particular, a dilution rate of $O_2$ gas is increased (a concentration is decreased), a supply time of $O_2$ gas is decreased, or a partial pressure of $O_2$ gas is decreased. For example, compared to Step 2 or Step 4, a dilution rate of the reactive gas may be increased, a supply time of the reactive gas may be decreased, or a partial pressure of the reactive gas may be decreased. Accordingly, since oxidizing power in Step 3 can be appropriately decreased, it is facilitated that the second layer is not to be saturated with the oxidation reaction.

When oxidizing power in Step 3 decreases, it is possible to suppress carbon from being desorbed from the second layer during oxidation. Since a Si—O bond has higher bond energy than a S—C bond, when Si—O bonds are formed, Si—C bonds tend to be separated. Accordingly, when oxidizing power in Step 3 is appropriately decreased, it is possible to suppress the S—C bonds from being separated when the Si—O bonds are formed in the second layer, and it is possible to suppress carbon whose bonds with silicon are broken from being desorbed from the second layer.

Also, when oxidizing power in Step 3 decreases, silicon remains exposed at the second layer after oxidation treatment, that is, the outermost surface of the third layer. When the state in which silicon is exposed to the outermost surface of the third layer continues, nitridation of the outermost surface of the third layer in Step 4 to be described below is facilitated. When the Si—O bonds or the S—C bonds are formed in the entire outermost surface of the third layer and silicon is not exposed to the outermost surface, the Si—N bonds are hardly formed under conditions of Step 4 to be described below. However, when silicon remains exposed at the outermost surface of the third layer, that is, when there is silicon that may bind to nitrogen in the outermost surface of the third layer under conditions of Step 4 to be described below, the formation of the Si—N bonds is facilitated.

(Residual Gas Removal)

After the third layer is formed, the valve 243b is closed to stop supply of $O_2$ gas. Also, according to the same processing sequences as in Step 1, an unreacted gas remaining in the process chamber 201 or $O_2$ gas that has contributed to formation of the third layer or reaction by-products are removed from the inside of the process chamber 201. In this case, similarly to Step 1, the gas remaining in the process chamber 201 and the like may not be completely removed.

As the oxidation gas, in addition to $O_2$ gas, a gas containing oxygen such as water vapor ($H_2O$ gas), nitrogen monoxide (NO) gas, nitrous oxide ($N_2O$) gas, nitrogen dioxide ($NO_2$) gas, carbon monoxide (CO) gas, carbon dioxide ($CO_2$) gas, ozone ($O_3$) gas, a mixed gas of hydrogen ($H_2$) gas and $O_2$ gas or a mixed gas of $H_2$ gas and $O_3$ gas may be used. As the inert gas, in addition to $N_2$ gas, various types of rare gases exemplified in Step 1 may be used.

[Step 4]

($NH_3$ Gas Supply)

After Step 3 is completed, thermally activated $NH_3$ gas is supplied to the wafer 200 in the process chamber 201, that is, the third layer formed on the wafer 200.

In this step, on-off control of the valves 243b through 243d is performed according to the same sequence as on-off control of the valves 243a, 243c and 243d in Step 1. $NH_3$ gas whose flow rate is regulated by the MFC 241b is supplied into the process chamber 201 through the nozzle 249b and the buffer chamber 237 and exhausted through the exhaust pipe 231. In this case, $NH_3$ gas is supplied to the wafer 200.

A supply flow rate of $NH_3$ gas controlled by the MFC 241b is set to, for example, a flow rate in a range of 100 sccm through 10,000 sccm. A pressure in the process chamber 201 is set to, for example, a pressure in a range of 1 Pa through 4,000 Pa, and preferably 1 Pa through 3,000 Pa. A partial pressure of $NH_3$ gas in the process chamber 201 is set to, for example, a pressure in a range of 0.01 Pa through 3,960 Pa. When the pressure in the process chamber 201 is set to a relatively high pressure range in this manner, it is possible to thermally activate $NH_3$ gas to non-plasma. When $NH_3$ gas is thermally activated and then supplied, since a relatively soft reaction can be caused, nitridation to be described below can be softly performed. A time for which $NH_3$ gas is supplied to the wafer 200, that is, a gas supply time (radiation time) is set to, for example, a time in a range of 1 second through 120 seconds, and preferably 1 second through 60 seconds. The other processing conditions are the same as, for example, the processing conditions of Step 1.

In this case, a gas flowing in the process chamber 201 is thermally activated $NH_3$ gas, and none of HCDS gas, $C_3H_6$ gas or $O_2$ gas flows in the process chamber 201. Therefore, $NH_3$ gas does not cause a gas-phase reaction and is supplied to the wafer 200 in an activated state. $NH_3$ gas supplied to the wafer 200 reacts with at least a part of the third layer (SiOC layer) formed on the wafer 200 in Step 3. Accordingly, the third layer is thermally nitridated to non-plasma and changed (modified) to a fourth layer containing silicon, oxygen, carbon and nitrogen, that is, a silicon oxycarbonitride layer (SiOCN layer). Also, when the fourth layer is formed, impurities such as chlorine included in the third layer form a gaseous material including at least chlorine during the modification reaction due to $NH_3$ gas and are discharged from the inside of the process chamber 201. That is, impurities such as chlorine in the third layer are extracted or desorbed from the third layer, and thus separated from the third layer. Therefore, the fourth layer becomes a layer having fewer impurities such as chlorine than the third layer.

Also, when activated $NH_3$ gas is supplied to the wafer 200, the outermost surface of the third layer is modified during nitridation of the third layer. A state of the outermost surface of the third layer after surface modification treatment is performed during nitridation, that is, the outermost surface of the fourth layer is in a state where the adsorption of HCDS and the deposition of silicon are facilitated in the following Step 1 or Step 5. That is, $NH_3$ gas used in Step 4 serves as an adsorption and deposition facilitating gas that facilitates HCDS or silicon to be adsorbed or deposited onto the outermost surface of the fourth layer [the outermost surface of the wafer 200].

In this case, the third layer is not saturated with the nitridation reaction. For example, when the third layer having a thickness of several atomic layers is formed in Steps 1 through 3, at least a part of the surface layer (one atomic layer of the surface) is nitridated. In this case, nitridation is performed under a condition in which the third layer is not saturated with the nitridation reaction such that the entire third layer is not nitridated. Also, according to conditions, several layers below the surface layer of the third layer can be nitridated. However, it is preferable that only the surface layer be nitridated, since controllability of a composition ratio of the first film formed on the wafer 200, that is, the finally formed laminate film, can increase. Also, a part of the surface layer is similarly nitridated, for example, when the third layer having a thickness of one atomic layer or less than one atomic layer is formed in Steps 1 through 3. In this case, nitridation is performed under a condition in which the third layer is not saturated with the nitridation reaction such that the entire third layer is not nitridated. Also, when processing conditions of Step 4 are set as processing conditions within the above-described range of processing conditions, the third layer may not be saturated with the nitridation reaction.

(Residual Gas Removal)

After the fourth layer is formed, the valve 243b is closed to stop supply of $NH_3$ gas. Also, according to the same processing sequences as in Step 1, an unreacted gas remaining in the process chamber 201 or $NH_3$ gas that has contributed to formation of the fourth layer or reaction by-products are removed from the inside of the process chamber 201. In this case, similarly to Step 1, the gas remaining in the process chamber 201 and the like may not be completely removed.

As the nitriding gas, in addition to $NH_3$ gas, a hydronitrogen-based gas such as diazene ($N_2H_2$) gas, hydrazine ($N_2H_4$) gas or $N_3H_8$ gas or a gas containing a compound thereof may be used. As the inert gas, in addition to $N_2$ gas, various types of rare gases exemplified in Step 1 may be used.

(Performing First Set a Predetermined Number of Times)

When a set (first set) in which Steps 1 through 4 are performed asynchronously, that is, performed without synchronization, is performed a predetermined number of times ($m_1$ times), it is possible to form the SiOCN film having a predetermined composition and a predetermined film thickness on the wafer 200 as the first film. In this case, the number of times the first set is performed is controlled such that the first film has a film thickness of, for example, 0.1 nm or more and 5 nm or less, preferably 0.1 nm or more and 3 nm or less, and more preferably 0.1 nm or more and 1 nm or less. The first set is preferably repeated a plurality of times in a range of, for example, once or more and 50 times or less, preferably once or more and 30 times or less, and more preferably once or more and 10 times or less. That is, a thickness of the fourth layer (SiOCN layer) formed when the first set is performed once is set to be smaller than a desired film thickness, and the first set is preferably repeated a plurality of times to obtain the desired film thickness of the first film.

(Step of Forming Second Film)

Then, the following two steps, Step 5 and Step 6, are sequentially performed.

[Step 5]

(HCDS Gas Supply)

In this step, HCDS gas is supplied to the wafer 200 in the process chamber 201, that is, the first film (the SiOCN film) formed on the wafer 200. Processing sequences and processing conditions of this step are the same as the above-described processing sequences and processing conditions of Step 1. Therefore, a silicon-containing layer containing chlorine having a thickness of, for example, less than one atomic layer to several atomic layers, is formed as a fifth layer on the first film formed on the wafer 200.

(Residual Gas Removal)

After the fifth layer is formed, according to the same processing sequences as in Step 1, supply of HCDS gas is stopped, and an unreacted gas remaining in the process chamber 201 or HCDS gas that has contributed to formation of the fifth layer is removed from the inside of the process chamber 201. In this case, similarly to Step 1, the gas remaining in the process chamber 201 may not be completely removed.

As the source gas, in addition to HCDS gas, various types of silane source gases exemplified in Step 1 may be used. Also, an effect of a composition of the finally formed laminate film when the organic halosilane source gas, the organic silane source gas or the amino-based silane source is used as the source gas is the same as that of Step 1. As the inert gas, in addition to $N_2$ gas, various types of rare gases exemplified in Step 1 may be used.

[Step 6]

(TMB Gas Supply)

After Step 1 is completed, thermally activated TMB gas is supplied to the wafer 200 in the process chamber 201, that is, the fifth layer formed on the first film.

In this step, on-off control of the valves 243b through 243d is performed according to the same sequence as on-off control of the valves 243a, 243c and 243d in Step 1. TMB gas whose flow rate is regulated by the MFC 241b is supplied into the process chamber 201 through the nozzle 249b and the buffer chamber 237 and exhausted through the exhaust pipe 231. In this case, TMB gas is supplied to the wafer 200.

A supply flow rate of TMB gas controlled by the MFC 241b is set to, for example, a flow rate in a range of 1 sccm through 1,000 sccm. A pressure in the process chamber 201 is set to, for example, a pressure in a range of 1 Pa through 2,666 Pa, and preferably 67 Pa through 1,333 Pa. A partial pressure of TMB gas in the process chamber 201 is set to, for example, a pressure in a range of 0.0001 Pa through 2,424 Pa. When the pressure in the process chamber 201 is set to a relatively high pressure range in this manner, it is possible to thermally activate TMB gas to non-plasma. When TMB gas is thermally activated and then supplied, since a relatively soft reaction can be caused, modification to be described below can be softly performed. That is, as will be described below, it is possible to maintain the borazine ring structure or some N—C bonds in TMB without breaking and adding either of these into a sixth layer is facilitated. A time for which TMB gas is supplied to the wafer 200, that is, a gas supply time (radiation time) is set to, for example, a time in a range of 1 second through 120 seconds, and preferably 1 second through 60 seconds. The other processing sequences and processing conditions are the same as, for example, the processing sequences and processing conditions of Step 1.

In this case, a gas flowing in the process chamber 201 is thermally activated TMB gas, and no HCDS gas flows in the process chamber 201. Therefore, TMB gas does not cause a gas-phase reaction and is supplied to the wafer 200 in an activated state. As a result, the fifth layer (the silicon-containing layer containing chlorine) formed in Step 5 reacts with TMB gas. That is, chlorine (a chloro group) included in the fifth layer reacts with a ligand (a methyl group, hereinafter referred to as an "organic ligand" or a "methyl ligand") included in TMB. Therefore, chlorine of the fifth layer that has reacted with the methyl ligand of TMB may be separated (extracted) from the fifth layer, and the methyl ligand of TMB that has reacted with chlorine of the fifth layer may be separated from TMB. Also, nitrogen of a borazine ring of TMB whose methyl ligand is separated may bind to silicon of the fifth layer. That is, it is possible to form the Si—N bond by combining nitrogen having a dangling bond due to a disconnection of the methyl ligand among boron and nitrogen of the borazine ring of TMB with silicon having a dangling bond due to inclusion in the fifth layer or silicon that has a dangling bond. In this case, the borazine ring structure forming the borazine ring of TMB is preserved without breaking. Also, some bonds of the borazine ring and the methyl ligand, that is, N—C bonds included in TMB, are preserved without breaking. Also, the methyl group is one of alkyl groups, and the methyl ligand may be called an alkyl ligand.

When TMB gas is supplied under the above-described conditions, since the fifth layer and TMB may appropriately react while the borazine ring structure or some N—C bonds of TMB are preserved without breaking, it is possible to cause the above-described reactions in series. While the borazine ring structure or the like of TMB is preserved, the most important factor (condition) for causing the reactions in series are considered to be the temperature of the wafer 200 and the pressure in the process chamber 201, and particularly, the temperature of the wafer 200. When these factors are appropriately controlled, it is possible to cause an appropriate reaction.

According to the reactions in series, the borazine ring is newly added into the fifth layer. Also, some methyl ligands of TMB, that is, some N—C bonds included in TMB are newly added into the fifth layer. Therefore, the fifth layer is changed (modified) to the sixth layer that has a borazine ring structure and contains silicon, boron, carbon and nitrogen, that is, a siliconboroncarbonitride layer (SiBCN layer) having a borazine ring structure. The sixth layer becomes a layer having a thickness of, for example, less than one atomic layer to several atomic layers. The SiBCN layer having a borazine ring structure may be called a layer that includes silicon, carbon and a borazine ring structure.

When the borazine ring is newly added into the fifth layer, a boron component and a nitrogen component forming the borazine ring are newly added into the fifth layer. Also, in this case, a carbon component included in the methyl ligand of TMB is added into the fifth layer. In this manner, when the fifth layer reacts with TMB and thus the carbon component included in the borazine ring or the methyl ligand is added into the fifth layer, it is possible to newly add the boron component, the carbon component and the nitrogen component into the fifth layer.

When the sixth layer is formed, chlorine included in the fifth layer forms a gaseous material including at least chlorine during the modification reaction of the fifth layer due to TMB gas and is discharged from the inside of the process chamber 201. That is, impurities such as chlorine in the fifth layer are extracted or desorbed from the fifth layer and thus separated from the fifth layer. Therefore, the sixth layer becomes a layer having fewer impurities such as chlorine than the fifth layer.

When the sixth layer is formed, the borazine ring structure forming the borazine ring included in TMB is preserved (maintained) without breaking, a center space of the borazine ring can be preserved (maintained) and a porous SiBCN layer can be formed.

(Residual Gas Removal)

After the sixth layer is formed, the valve 243b is closed to stop supply of TMB gas. Also, according to the same processing sequences as in Step 1, an unreacted gas remaining in the process chamber 201 or TMB gas that has contributed to formation of the sixth layer or reaction by-products are removed from the inside of the process chamber 201. In this case, similarly to Step 1, the gas remaining in the process chamber 201 and the like may not be completely removed.

As the gas having a borazine ring structure, in addition to TMB gas, for example, TEB gas, TPB gas, TIPB gas, TBB gas or TIBB gas may be used. As the inert gas, in addition to $N_2$ gas, rare gases such as Ar gas, He gas, Ne gas and Xe gas may be used.

(Performing Second Set a Predetermined Number of Times)

When a set (second set) in which Steps 5 and 6 are performed asynchronously is performed a predetermined number of times ($m_2$ times), that is, when Steps 5 and 6 are alternately performed once or more, it is possible to form a SiBCN film having a predetermined composition and a predetermined film thickness and having a borazine ring structure on the first film (the SiOCN film) as the second film. In this case, the number of times the second set is performed is controlled such that the second film has a film thickness of, for example, 0.1 nm or more and 5 nm or less, preferably 0.1 nm or more and 3 nm or less, and more preferably 0.1 nm or more and 1 nm or less. Similarly to the step of forming the first film, the second set is preferably repeated a plurality of times in a range of, for example, once or more and 50 times or less, preferably once or more and 30 times or less, and more preferably once or more and 10 times or less.

(Performing Cycle a Predetermined Number of Times)

Also, when a cycle including the step of forming the first film and the step of forming the second film is performed a predetermined number of times (n times), that is, when the step of forming the first film and the step of forming the second film are alternately performed once or more, it is possible to form a laminate film (hereinafter also referred to as a "nanolaminate film") in which the first film (the SiOCN film) and the second film (the SiBCN film having a borazine ring structure) are alternately laminated at a nano level on the wafer 200. The laminate film as an entire film becomes a film that has a borazine ring structure and contains silicon, boron, oxygen, carbon and nitrogen, that is, the SiBOCN film having a borazine ring structure.

(Purging and Restoring to Atmospheric Pressure)

After the formation of the laminate film is completed, the valves 243c and 243d are opened, and $N_2$ gas is supplied into the process chamber 201 through the gas supply pipes 232c and 232d and exhausted through the exhaust pipe 231. $N_2$ gas serves as a purge gas. Therefore, the inside of the process chamber 201 is purged, and a gas remaining in the process chamber 201 or reaction by-products are removed from the inside of the process chamber 201 (purge). Then, an atmosphere in the process chamber 201 is replaced with the inert gas (inert gas replacement), and the pressure in the process chamber 201 is restored to a normal pressure (restoration to atmospheric pressure).

(Boat Unloading and Wafer Discharging)

The seal cap 219 is lowered by the boat elevator 115, and the lower end of the reaction tube 203 is opened. Also, the processed wafer 200 is unloaded (boat unloading) to the outside of the reaction tube 203 from the lower end of the reaction tube 203 while being held on the boat 217. The processed wafer 200 is extracted from the boat 217 (wafer discharge).

(3) Effects of the Present Embodiment

According to the present embodiment, one or a plurality of effects to be described will be obtained.

(a) When the first film (the SiOCN film) containing oxygen and the oxygen-free second film (the SiBCN film having a borazine ring structure) are alternately laminated, it is possible to increase controllability of the composition ratio of the finally formed laminate film. That is, when the laminate film is formed, it is possible to add a desired amount of oxygen into the film while suppressing boron, carbon and nitrogen from being desorbed from the film. As a result, it is possible to increase a concentration of boron, a concentration of carbon, and a concentration of nitrogen in the finally formed laminate film to a desired concentration, and this film may become the SiBOCN film. When the concentration of carbon in the laminate film increases, it is possible to increase resistance of the film to hydrogen fluoride (HF), that is, etch resistance.

Also, in the following exemplified film formation technique, that is, in a general film formation technique in which HCDS gas, $BCl_3$ gas, $C_3H_6$ gas, $NH_3$ gas and $O_2$ gas are sequentially supplied to form a single film, it is difficult to add a desired amount of boron and carbon into the finally formed film. That is, in such a film formation technique, a boron-free SiOCN film, a boron- and carbon-free silicon oxynitride film (SiON film), or a boron-, carbon- and nitrogen-free silicon oxide film (SiO film) may be formed on the wafer, but it is difficult to form the SiBOCN film.

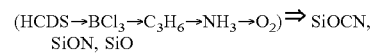

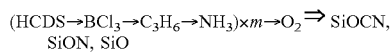
(HCDS→BCl₃→C₃H₆→NH₃)×m→O₂ ⇒ SiOCN, SiON, SiO

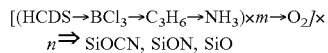
[(HCDS→BCl₃→C₃H₆→NH₃)×m→O₂]×
n ⇒ SiOCN, SiON, SiO

This is because, due to high energy of $O_2$ gas supplied during the film formation process, chemical bonds (such as Si—B bonds and Si—C bonds) formed by boron or carbon that are included in the already formed layer (SiBCN layer) are broken and a great amount of boron, carbon and the like are desorbed from the layer. Also, the inventors confirmed that, when active $O_2$ gas is supplied to the SiBCN layer being free of a borazine ring structure, boron, carbon and nitrogen in order are more likely to be desorbed from the layer, that is, among boron, carbon and nitrogen, boron is most likely to be desorbed, and carbon is next most likely to be desorbed.

Therefore, according to the film formation technique of the present embodiment, since a concentration of boron, a concentration of carbon and the like in the finally formed laminate film can sufficiently increase, it is possible to form the SiBOCN film on the wafer 200.

In summary, even when Step 3 in which active $O_2$ gas is supplied to the wafer 200 is performed during the formation of the first film, $O_2$ gas is mainly supplied to the outermost surface of the wafer 200 as a laminate, that is, the second layer (a layer containing silicon, chlorine and carbon) formed on the wafer 200. That is, $O_2$ gas supplied in Step 3 hardly reaches a layer below the second layer, that is, the second film that is formed as a base of the first film. Accordingly, a desorption action of boron, carbon and nitrogen due to $O_2$ gas supplied in Step 3 mainly influences the second layer formed on the outermost surface of the wafer 200, but hardly influences the second film that is formed below the layer. As a result, boron, carbon and nitrogen are rarely desorbed from the second film and the like. Therefore, it is possible to suppress a concentration of boron, a concentration of carbon and the like in the finally formed laminate film from decreasing.

Also, when the second layer is set as a discontinuous layer having a thickness of, for example, less than one atomic layer, $O_2$ gas supplied during the formation of the first film may be supplied to the second layer and the second film (the SiBCN film) that is formed as a base of the layer. However, in this case, boron and the like are rarely desorbed from the second film. In summary, the second film is a film having a borazine ring structure and includes boron or nitrogen as an element of the borazine ring structure forming the film. A B—N bond forming the borazine ring structure has a strong bond due to less attraction (less polarity) of shared electrons. Accordingly, the second film having a borazine ring structure becomes a film that has less desorption of boron or nitrogen from the film due to oxidation and higher oxidation resistance than the SiBCN film being free of a borazine ring structure that is formed using, for example, HCDS gas, $BCl_3$ gas, $C_3H_6$ gas and $NH_3$ gas. As a result, even when $O_2$ gas supplied in Step 3 reaches the second film, boron, nitrogen or the like is rarely desorbed from the second film. Therefore, it is possible to suppress a concentration of boron and a concentration of carbon in the finally formed laminate film from decreasing.

(b) When the first film being free of a borazine ring structure and the second film having a borazine ring structure are alternately laminated, and the borazine ring structure is included in the finally formed laminate film, the laminate film may become a film having high oxidation resistance. This is because the film having a borazine ring structure includes boron or nitrogen as an element of the borazine ring structure forming the film, as described above. The laminate film having a borazine ring structure becomes a film that has less desorption of boron and the like from the film due to oxidation and has high oxidation resistance, for example, a film having high resistance to oxygen plasma and the like, that is, a film having high ash resistance. Also, when oxidation resistance of the laminate film increases, it is possible to suppress a change in characteristics of the laminate film when oxygen plasma or the like is supplied. For example, it is possible to suppress etch resistance of the laminate film from decreasing.

(c) When the first film being free of a borazine ring structure and the second film having a borazine ring structure are alternately laminated, and the borazine ring structure is included in the finally formed laminate film, the laminate film may become a film having a low dielectric constant. This is because the film having a borazine ring structure is a porous film, and becomes a film that has a lower film density, that is, a lower atomic density in the film, than a non-porous film being free of a borazine ring structure. When the first film being free of a borazine ring structure and the second film having a borazine ring structure are alternately laminated, it is possible to decrease a dielectric constant of the finally formed laminate film compared to a case in which only the first film is laminated to form a single film.

(d) When the first film being free of a borazine ring structure and the second film having a borazine ring structure are alternately laminated, it is possible to improve surface roughness of the finally formed laminate film. Here, the term "surface roughness" refers to a height difference within planes of the wafer or within planes of any target and has the same meaning as surface irregularity. The phrase "surface roughness is improved" means that "a height difference decreases," that is, "a surface becomes smooth." The phrase "surface roughness is degraded" means that "a height difference increases," that is, "a surface becomes rough."

The film being free of a borazine ring structure tends to have further improved surface roughness than the film having a borazine ring structure. Therefore, when the first film being free of a borazine ring structure having good surface roughness and the second film having a borazine ring structure are alternately laminated, it is possible to further improve surface roughness of the finally formed laminate film than when only the second film is laminated to form a single film.

Also, when a cycle in which the first film and the second film are alternately formed is performed a predetermined number of times, it is preferable that the first film having good surface roughness be formed first. That is, the first film is preferably formed before the second film is formed. That is, before the second film is formed, the first film is preferably formed first as a base of the formation. Also, the second film is preferably formed on the first film that is previously formed. That is, a bottommost part of the laminate film formed by lamination of the first film and the second film is preferably formed by the first film having good surface roughness. Therefore, it is possible to further improve surface roughness of the finally formed laminate film.

Also, when a cycle in which the first film and the second film are alternately formed is performed a predetermined number of times, it is preferable that the first film having good surface roughness be formed last. That is, when the second film is formed in the final cycle, it is preferable that a surface thereof be covered with the first film. That is, a topmost part of the laminate film formed by lamination of the first film and the second film is preferably formed by the first film having good surface roughness. Therefore, it is possible to further improve surface roughness of the finally formed laminate film.

(e) When the first film and the second film are alternately laminated, if a film thickness ratio between these films is appropriately regulated, it is possible to freely control a composition ratio of the finally formed laminate film, a ratio of the borazine ring structure included in the laminate film or the like.

In the second film (the SiBCN film having a borazine ring structure) that is formed using, for example, HCDS gas and TMB gas, a ratio (hereinafter also referred to as a "B/N ratio") between a boron component and a nitrogen component included in the film is determined by a ratio (1/1) between the number of boron atoms and the number of nitrogen atoms included in one molecule of TMB gas, that is, a type of the borazine-based gas. That is, when only the second film is laminated to form a single film, it is difficult to set the B/N ratio to be largely different from 1/1. Therefore, when the boron-free first film (the SiOCN film) containing nitrogen and the second film are alternately laminated and a film thickness ratio between these films is appropriately regulated, it is possible to set the B/N ratio of the finally formed laminate film as a value that is largely different from 1/1, that is, any value (for example, 1/2 or 1/3) less than 1/1.

Also, for example, when the first film being free of a borazine ring structure and the second film having a borazine ring structure are alternately laminated and a film thickness ratio between these films is appropriately regulated, a ratio (an amount per unit volume) of the borazine ring structure included in the finally formed laminate film can be any ratio lower than that when only the second film is laminated to form a single film. Also, when the ratio of the borazine ring structure included in the laminate film is regulated, it is possible to finely regulate an amount of elements other than boron (silicon, oxygen, carbon and nitrogen) included in the laminate film.

(f) When the first film and the second film are alternately laminated in this manner, the finally formed laminate film may be a film having either or both characteristics of the first film and the second film, a film having an intermediate characteristic of the first film and the second film or a film having a different characteristic from the first film and the second film. In this case, as described above, film thicknesses of the first film and the second film are preferably set to, for example, 0.1 nm or more and 5 nm or less, preferably 0.1 nm or more and 3 nm or less, and more preferably 0.1 nm or more and 1 nm or less.

It is difficult to set film thicknesses of the first film and the second film to be less than 0.1 nm. Also, when any of the first film and the second film has a film thickness of greater than 5 nm, the finally formed laminate film becomes a film having a non-unified (irregular) characteristic in a lamination direction, that is, a film in which the first film and the second film are simply laminated and characteristics thereof are separated in a lamination direction. When film thicknesses of the first film and the second film are set through 0.1 nm or more and 5 nm or less, preferably 0.1 nm or more and 3 nm or less, and more preferably 0.1 nm or more and 1 nm or less, the finally formed laminate film may be a film having a unified characteristic in a lamination direction, that is, a film in which characteristics and properties of the first film and the second film appropriately converge. Also, when film thicknesses of the first film and the second film are set through 3 nm or less, it is possible to obtain a laminate film in which characteristics and properties of these films further sufficiently converge. Also, when film thicknesses of the first film and the second film are set through 1 nm or less, it is possible to obtain a laminate film in which characteristics and properties of these films surely converge. That is, when film thicknesses of the first film and the second film are set to film thicknesses within the above-described range, the finally formed laminate film may be a nanolaminate film having an integral characteristic as an entire film. Also, when the number of times the above-described set is performed ($m_1$ times and $m_2$ times) is set to once or more and 50 times or less, preferably once or more and 30 times or less, and more preferably once or more and 10 times or less, film thicknesses of the first film and the second film may be set to film thicknesses within the above-described range. Also, when film thicknesses of the first film and the second film become smaller, that is, when the number of times the above-described set is performed ($m_1$ times and $m_2$ times) decreases, it is possible to improve surface roughness of the finally formed laminate film.

(g) When Steps 1 through 4 and Steps 5 and 6 are asynchronously performed, that is, when the source gas and various types of reactive gases are supplied without synchronization, gases may appropriately react under a condition in which a gas-phase reaction or a surface reaction is appropriately caused. As a result, it is possible to increase a step coverage and film thickness controllability of the first film and the second film. That is, it is possible to increase a step coverage and film thickness controllability of the finally formed laminate film. Also, since an excessive gas-phase reaction in the process chamber 201 can be prevented, it is possible to suppress particles from being generated.

(h) The above-described effects may be similarly obtained when a gas other than HCDS gas is used as the source gas, when a gas other than TMB gas is used as the borazine-based gas, when a gas other than $C_3H_6$ gas is used as the carbon-containing gas, when a gas other than $O_2$ gas is used as the oxygen-containing gas, or when a gas other than $NH_3$ gas is used as the nitrogen-containing gas.

(4) Modifications

The film formation sequence in the present embodiment is not limited to the sequence illustrated in FIG. 4, but may be changed as in modifications to be described below.

Modifications 1 through 6

According to the following film formation sequence (in order of Modifications 1 through 6), as a first film, a silicon oxycarbide film (SiOC film), a silicon carbonitride film (SiCN film), a silicon nitride film (SiN film), a SiON film, a SiO film and a silicon carbide film (SiC film) may be formed. That is, as illustrated in Modifications 1 through 6 in FIG. 5, these first films (the SiOC film, the SiCN film, the SiN film, the SiON film, the SiO film and the SiC film) and the second film (the SiBCN film having a borazine ring structure) may be alternately laminated. Also, the SiOC film, the SiCN film and the SiC film may be called a SiO film containing carbon, a SiN film containing carbon and a Si film containing carbon, respectively. According to these modifications, the same effects as in the film formation sequence illustrated in FIG. 4 may be obtained. Laminate films formed by Modifications 1 through 6 may be called a SiOC film having a borazine ring structure, a SiCN film having a borazine ring structure, a SiN film having a borazine ring structure, a SiON film having a borazine ring structure, a SiO film having a borazine ring structure and a SiC film having a borazine ring structure, respectively.

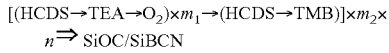
[(HCDS→TEA→O₂)×m₁→(HCDS→TMB)]×m₂× n ⇒ SiOC/SiBCN

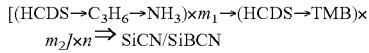
[(HCDS→C₃H₆→NH₃)×m₁→(HCDS→TMB)× m₂]×n ⇒ SiCN/SiBCN

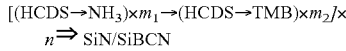
[(HCDS→NH₃)×m₁→(HCDS→TMB)×m₂]× n ⇒ SiN/SiBCN

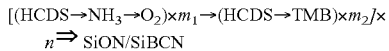
[(HCDS→NH₃→O₂)×m₁→(HCDS→TMB)×m₂]× n ⇒ SiON/SiBCN

[(HCDS→O₂)×m₁→(HCDS→TMB)×m₂]×n ⇒ SiO/SiBCN

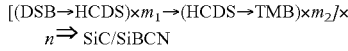
[(DSB→HCDS)×m₁→(HCDS→TMB)×m₂]× n ⇒ SiC/SiBCN

Modifications 7 through 9

According to the following film formation sequence (in order of Modifications 7 through 9), as a second film, a silicon boron nitride film (SiBN film) having a borazine ring structure, a boron carbonitride film (BCN film) having a borazine ring structure and a boron nitride film (BN film) having a borazine ring structure may be formed. That is, as illustrated in Modifications 7 through 9 in FIG. 5, the first film (the SiOCN film) and the above-described second film (the SiBN film, the BCN film and the BN film having a borazine ring structure) may be alternately laminated. According to these modifications, the same effects as in the film formation sequence illustrated in FIG. 4 and the above-described modifications may be obtained. Also, in Modification 8, when the second film is formed, while thermally activated NH₃ gas is continuously supplied to the wafer 200, TMB gas is intermittently supplied. Also, in Modification 9, when the second film is formed, while NH₃ gas excited to plasma is continuously supplied to the wafer 200, TMB gas is intermittently supplied.

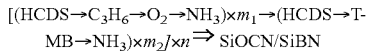
[(HCDS→C₃H₆→O₂→NH₃)×m₁→(HCDS→TMB→NH₃)×m₂]×n ⇒ SiOCN/SiBN

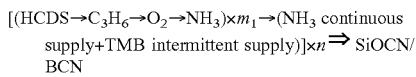
[(HCDS→C₃H₆→O₂→NH₃)×m₁→(NH₃ continuous supply+TMB intermittent supply)]×n ⇒ SiOCN/BCN

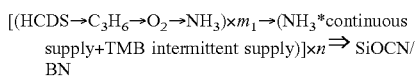
[(HCDS→C₃H₆→O₂→NH₃)×m₁→(NH₃*continuous supply+TMB intermittent supply)]×n ⇒ SiOCN/BN Modifications 10 through 27

The film formation sequence illustrated in FIG. 4 or the above-described modifications may be arbitrarily combined. That is, as illustrated in Modifications 10 through 27 in FIG. 5, any of the SiOC film, the SiCN film, the SiN film, the SiON film, the SiO film and the SiC film is formed as the first film, and any of the SiBN film, the BCN film and the BN film having a borazine ring structure is formed as the second film, and these films may be alternately laminated. According to these modifications, the same effects as in the film formation sequence illustrated in FIG. 4 and the above-described modifications may be obtained.

Modification 28

Any of the SiOCN film, the SiOC film, the SiON film and the SiO film is formed as the first film, any of the SiBCN film, the SiBN film, the BCN film and the BN film being free of a borazine ring structure is formed as the second film according to the following film formation sequence, and these films may be alternately laminated. That is, the first film that contains oxygen and is free of a borazine ring structure, the second film being free of oxygen and a borazine ring structure are alternately laminated, and thus a laminate film that contains oxygen and is free of a borazine ring structure may be formed. According to the present modification, the same effects as in the film formation sequence illustrated in FIG. 4 may be obtained. Also, according to the present modification, it is possible to form the SiBOCN film without inclusion of the borazine ring structure to the first film and the second film. The following film formation sequence provides an example in which, sequentially, the SiOCN film is formed as the first film, and the SiBCN film and the SiBN film being free of a borazine ring structure are formed as the second film, and these films are alternately laminated to form the SiBOCN film.

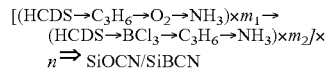
[(HCDS→C₃H₆→O₂→NH₃)×m₁→(HCDS→BCl₃→C₃H₆→NH₃)×m₂]× n ⇒ SiOCN/SiBCN

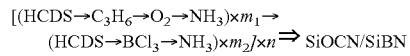
[(HCDS→C₃H₆→O₂→NH₃)×m₁→(HCDS→BCl₃→NH₃)×m₂]×n ⇒ SiOCN/SiBN

Also, any of the SiCN film, the SiN film and the SiC film being free of oxygen is formed as the first film, and any of the SiBCN film, the SiBN film, the BCN film and the BN film being free of a borazine ring structure is formed as the second film, and these films may be alternately laminated. In this case, it is possible to increase controllability of the composition ratio of the finally formed laminate film.

Modification 29

In the film formation sequence illustrated in FIG. 4 or the above-described modifications, the carbon-containing gas such as C₃H₆ gas may be simultaneously supplied with the source gas such as HCDS gas or the reactive gas such as TMB gas, O₂ gas, NH₃ gas, TEA gas or BCl₃ gas. That is, the step of supplying C₃H₆ gas may be simultaneously performed with at least any of the step of supplying the source gas and the step of supplying a reactive gas other than C₃H₆ gas.

In the present modification, the same effects as in the film formation sequence illustrated in FIG. 4 or the above-described modifications may be obtained. Also, when C₃H₆ gas is not simultaneously supplied with the source gas such as HCDS gas but is simultaneously supplied with TMB gas, O₂ gas, NH₃ gas, TEA gas or BCl₃ gas, it is preferable since an excessive gas-phase reaction in the process chamber 201 can be prevented and it is possible to suppress particles from being generated. Also, when C₃H₆ gas is not simultaneously supplied with NH₃ gas, O₂ gas or BCl₃ gas but is simultaneously supplied with TMB gas or TEA gas, it is preferable since it is possible to increase controllability of the composition ratio of the film to be formed.

Modification 30

In the film formation sequence illustrated in FIG. 4 or the above-described modifications, a step of supplying a boron-containing gas being free of a borazine ring structure such as BCl$_3$ gas to the wafer 200 may be additionally performed. The step of supplying BCl$_3$ may be asynchronously performed with the step of supplying the source gas such as HCDS gas or the step of supplying the reactive gas such as TMB gas, O$_2$ gas, NH$_3$ gas, TEA gas or C$_3$H$_6$ gas, or may be simultaneously performed with at least any of these steps. According to the present modification, the same effects as in the film formation sequence illustrated in FIG. 4 or the above-described modifications may be obtained. Also, according to the present modification, since a boron component included in BCl$_3$ gas can be added into the finally formed film, it is possible to further increase a concentration of boron in the finally formed film.

(Processing Conditions)

In the step of supplying thermally activated TEA gas to the wafer 200 in the above-described modification, a supply flow rate of TEA gas controlled by the MFC 241b is set to, for example, a flow rate in a range of 100 sccm through 10,000 sccm. A pressure in the process chamber 201 is set to, for example, a pressure in a range of 1 Pa through 5,000 Pa, and preferably 1 Pa through 4,000 Pa. Also, a partial pressure of TEA gas in the process chamber 201 is set to, for example, a pressure in a range of 0.01 Pa through 4,950 Pa. A time for which TEA gas is supplied to the wafer 200, that is, a gas supply time (radiation time), is set to, for example, a time in a range of 1 second through 200 seconds, preferably 1 second through 120 seconds, and more preferably 1 second through 60 seconds. The other processing conditions are the same as, for example, the processing conditions of Step 2 of the film formation sequence illustrated in FIG. 4. As the gas containing nitrogen and carbon, in addition to TEA gas, for example, an ethylamine-based gas such as diethylamine [(C$_2$H$_5$)$_2$NH, abbreviation: DEA]gas and monoethylamine (C$_2$H$_5$NH$_2$, abbreviation: MEA) gas or a methylamine-based gas such as trimethylamine [(CH$_3$)$_3$N, abbreviation: TMA]gas, dimethylamine [(CH$_3$)$_2$NH, abbreviation: DMA]gas and monomethylamine (CH$_3$NH$_2$, abbreviation: MMA) gas may be used.

Also, in the step of supplying thermally activated BCl$_3$ gas to the wafer 200, a supply flow rate of BCl$_3$ gas controlled by the MFC 241b is set to, for example, a flow rate in a range of 100 sccm through 10,000 sccm. A pressure in the process chamber 201 is set to, for example, a pressure in a range of 1 Pa through 2,666 Pa, and preferably 67 Pa through 1,333 Pa. A partial pressure of BCl$_3$ gas in the process chamber 201 is set to, for example, a pressure in a range of 0.01 Pa through 2,640 Pa. A time for which BCl$_3$ gas is supplied to the wafer 200, that is, a gas supply time (radiation time) is set to, for example, a time in a range of 1 second through 120 seconds, and preferably 1 second through 60 seconds. The other processing conditions are the same as, for example, the processing conditions of Step 1 of the film formation sequence illustrated in FIG. 4. As the boron-containing gas being free of a borazine ring structure, in addition to BCl$_3$ gas, for example, monochloroborane (BClH$_2$) gas, dichloroborane (BCl$_2$H) gas, trifluoroborane (BF$_3$) gas, tribromoborane (BBr$_3$) gas or diborane (B$_2$H$_6$) gas may be used.

Also, in the step of supplying NH$_3$ gas excited to plasma to the wafer 200, a supply flow rate of NH$_3$ gas controlled by the MFC 241b is set to, for example, a flow rate in a range of 100 sccm through 10,000 sccm. High frequency power (RF power) applied between the rod-shaped electrodes 269 and 270 is set to, for example, power in a range of 50 W to 1,000 W. A pressure in the process chamber 201 is set to, for example, a pressure in a range of 1 Pa through 500 Pa, and preferably 1 Pa through 100 Pa. A partial pressure of NH$_3$ gas in the process chamber 201 is set to, for example, a pressure in a range of 0.01 Pa through 495 Pa and preferably 0.01 Pa through 99 Pa. When plasma is used, even if the pressure in the process chamber 201 is set to a relatively low pressure range in this manner, it is possible to activate NH$_3$ gas. The other processing conditions are the same as, for example, the processing conditions of Step 2 of the film formation sequence illustrated in FIG. 4.

Processing sequences and processing conditions of the other steps may be the same as, for example, the processing sequences and processing conditions of the steps of the film formation sequence illustrated in FIG. 4.

Other Embodiments of the Present Invention

Embodiments of the present invention have been specifically described above. However, the present invention is not limited to the above-described embodiments, but may be variously changed without departing from the scope of the invention.

For example, the above-described embodiment has been described as an example in which the source gas is supplied, and then the reactive gas (the boron-containing gas, the nitrogen-containing gas, the carbon-containing gas and the nitrogen- and carbon-containing gas) is supplied. The present invention is not limited thereto, but a supply order of the source gas and the reactive gas may be reversed. That is, the reactive gas may be supplied, and then the source gas may be supplied. When the supply order is changed, it is possible to change film quality or the composition ratio of the thin film to be formed. Also, a supply order of a plurality of types of reactive gases may be arbitrarily changed. When the supply order of the reactive gas is changed, it is possible to change film quality or the composition ratio of the thin film to be formed. Also, the plurality of types of reactive gases may be arbitrarily combined and simultaneously supplied, that is, the plurality of types of reactive gases may be mixed in any combination and used. Therefore, it is possible to change film quality or the composition ratio of the thin film to be formed.

Also, for example, the above-described embodiment has been described as an example in which TMB gas, which is the organic borazine-based gas, is used as the borazine-based gas. The present invention is not limited thereto. For example, as the borazine-based gas, for example, a carbon-free borazine-based gas such as borazine (B$_3$H$_6$N$_3$) gas, that is, an inorganic borazine-based gas, may be used. When the inorganic borazine-based gas is used as the borazine-based gas in the film formation sequence illustrated in FIG. 4, a carbon-free film (SiBN film) having a borazine ring structure is formed as the second film. As a result, it is possible to appropriately decrease a concentration of carbon in the finally formed laminate film.

When a silicon-based insulation film formed by the film formation sequence illustrated in FIG. 4 or a technique of each of the modifications is used as a sidewall spacer, it is possible to provide device forming technology having a low leakage current and excellent processability. Also, when the above-described silicon-based insulation film is used as an etch stopper, it is possible to provide device forming technology having excellent processability. Also, according to the film formation sequence illustrated in FIG. 4 or some modifications, it is possible to form a silicon-based insulation film having an ideal stoichiometric ratio without using plasma. Since the silicon-based insulation film can be formed without using plasma, adaptation to a process in which plasma damage is a concern, for example, an SADP film of DPT, may be possible.

The above-described film formation sequence may be preferably applied when a multi-element metal film containing a metal element such as titanium (Ti), zirconium (Zr), hafnium (Hf), tantalum (Ta), niobium (Nb), aluminum (Al), molybdenum (Mo) or tungsten (W) and at least one specific element selected from the group consisting of boron, oxygen, carbon and nitrogen is formed on the wafer 200. That is, the present invention may be preferably applied, for example, when a metallic first film to be described below and a second film to be described below are alternately laminated in any combination to form a laminate film.

First films: TiOCN film, TiOC film, TiCN film, TiN film, TiON film, TiO film, TiC film, ZrOCN film, ZrOC film, ZrCN film, ZrN film, ZrON film, ZrO film, ZrC film, HfOCN film, HfOC film, HfCN film, HfN film, HfON film, HfO film, HfC film, TaOCN film, TaOC film, TaCN film, TaN film, TaON film, TaO film, TaC film, NbOCN film, NbOC film, NbCN film, NbN film, NbON film, NbO film, NbC film, AlOCN film, AlOC film, AlCN film, AN film, AlON film, AlO film, AlC film, MoOCN film, MoOC film, MoCN film, MoN film, MoON film, MoO film, MoC film, WOCN film, WOC film, WCN film, WN film, WON film, WO film, WC film.

Second films: TiBCN film, TiBN film, ZrBCN film, ZrBN film, HfBCN film, HfBN film, TaBCN film, TaBN film, NbBCN film, NbBN film, AlBCN film, AlBN film, MoBCN film, MoBN film, WBCN film, WBN film, BCN film, BN film (all of the films may be any of a film having a borazine ring structure and a film being free of a borazine ring structure).

In these cases, as the source gas, instead of the source gas containing a semiconductor element such as silicon in the above-described embodiment, a source gas containing a metal element may be used. As the reactive gas, the same gas as in the above-described embodiment may be used. Processing sequences and processing conditions in this case may be the same as, for example, the processing sequences and processing conditions of the above-described embodiments or modifications. In this case, the same effects as in the above-described embodiments or modifications can be obtained.

That is, the present invention may be preferably used when a multi-element film including a predetermined element such as a semiconductor element or a metal element and at least one specific element selected from the group consisting of boron, oxygen, carbon and nitrogen is formed.

A process recipe (a program in which processing sequences, processing conditions and the like of substrate processing are described) used in the formation of various types of thin films may preferably be separately prepared (prepared in a plurality of recipes) according to content (a film type, a composition ratio, film quality, a film thickness, processing sequences, processing conditions and the like of the thin film to be formed) of substrate processing. Hereinafter, the process recipe is simply referred to as a recipe. Also, when the substrate processing starts, an appropriate recipe is preferably appropriately selected from among the plurality of recipes according to content of the substrate processing. Specifically, the plurality of recipes separately prepared according to content of the substrate processing are preferably stored (installed) in advance in the memory device 121*c* provided in the substrate processing apparatus through telecommunication lines or the non-transitory computer-readable recording medium [the external memory device 123] recording the recipe. Also, when the substrate processing starts, the CPU 121*a* provided in the substrate processing apparatus preferably appropriately selects an appropriate recipe according to content of the substrate processing from among the plurality of recipes stored in the memory device 121*c*. In such a configuration, it is possible to generally and repeatedly form the thin film having various film types, composition ratios, film qualities and film thicknesses in the single substrate processing apparatus. Also, it is possible to decrease an operation load (such as a load for inputting processing sequences or processing conditions) of an operator, thereby preventing operation errors and quickly starting the substrate processing.

In addition to creating a new process recipe, the above-described process recipe may be prepared by, for example, changing an existing recipe that is previously installed in the substrate processing apparatus. When the recipe is changed, the changed recipe may be installed in the substrate processing apparatus through the telecommunication lines or the non-transitory computer-readable recording medium recording the recipe. Also, by manipulating the I/O device 122 provided in the existing substrate processing apparatus, the existing recipe that is previously installed in the substrate processing apparatus may be directly changed.

In the above-described embodiment, the example in which the thin film is formed using the batch-type substrate processing apparatus that processes a plurality of substrates at once has been described. However, the present invention is not limited to the above-described embodiment, but may be preferably applied, for example, when the thin film is formed using a single substrate processing apparatus that processes one or several substrates at once. Also, in the above-described embodiment, the example in which the thin film is formed using the substrate processing apparatus including a hot wall-type processing furnace has been described. However, the present invention is not limited to the above-described embodiment, but may be preferably applied when the thin film is formed using a substrate processing apparatus including a cold wall-type processing furnace. In this case, processing sequences and processing conditions may be the same as, for example, the processing sequences and processing conditions of the above-described embodiment.

Figure 10A:
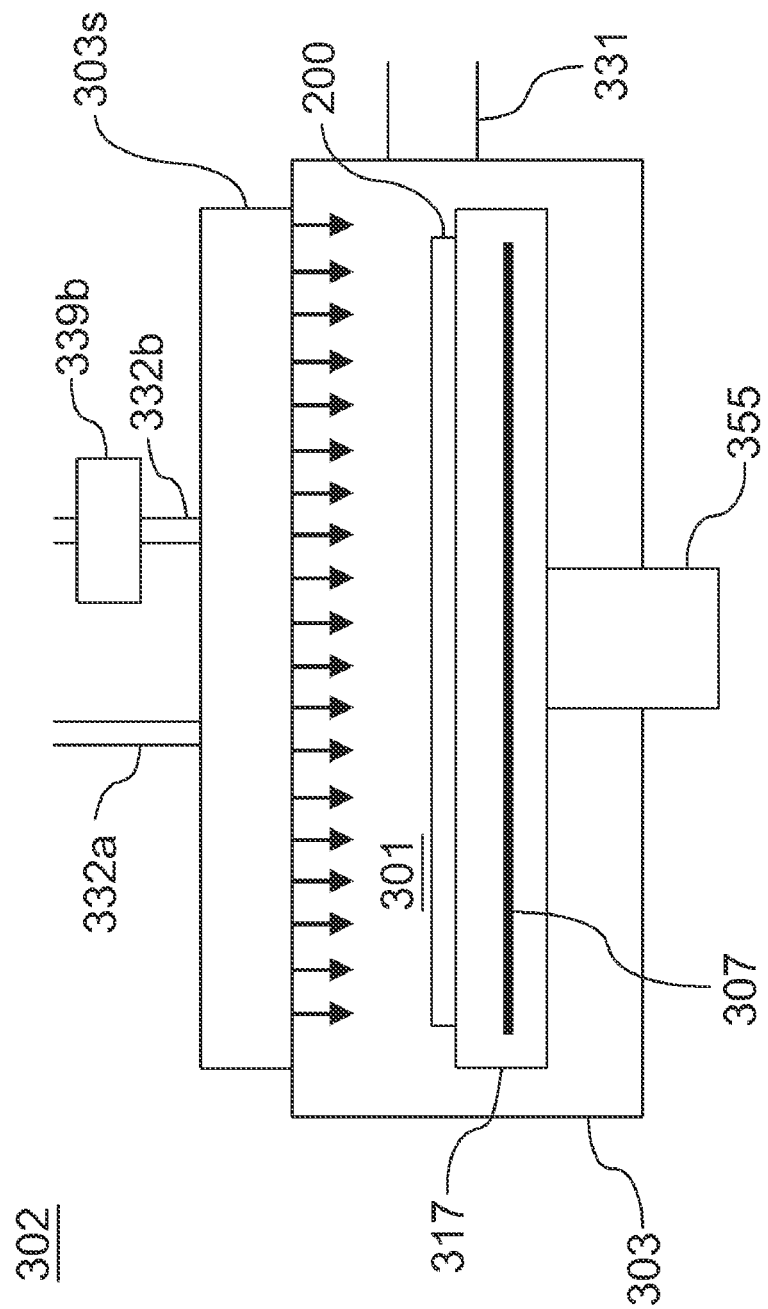
FIG. 10a is a schematic configuration diagram of a processing furnace of a substrate processing apparatus preferably used in another embodiment of the present invention and is a vertical cross-sectional view of a processing furnace portion.

For example, even when a substrate processing apparatus including a processing furnace 302 illustrated in FIG. 10*a* is used to form a film, the present invention may be preferably applied. The processing furnace 302 includes a process container 303 forming a process chamber 301, a shower head 303*s* serving as a gas supply unit configured to supply a gas in a shower form into the process chamber 301, a support 317 configured to support one or several wafers 200 in a horizontal orientation, a rotary shaft 355 configured to support the support 317 from below, and a heater 307 provided in the support 317. A gas supply port 332*a* configured to supply the source gas and a gas supply port 332*b* configured to supply the reactive gas are connected to an inlet (gas introducing port) of the shower head 303*s*. The same gas supply system as the source gas supply system of the above-described embodiment is connected to the gas supply port 332*a*. A remote plasma unit (plasma generating device) 339*b* serving as an exciting unit configured to excite the reactive gas to plasma and supply the excited gas, and the same gas supply system as the reactive gas supply system of the above-described embodiment are connected to the gas supply port 332*b*. A gas dispersion plate configured to supply a gas in a shower form into the process chamber 301 is provided in an outlet (gas discharging port) of the shower head 303*s*. The shower head 303*s* is provided at a location facing a surface of the wafer 200 loaded in the process chamber 301. An exhaust port 331 configured to exhaust the inside of the process chamber 301 is provided in the process container 303. The same exhaust system as the exhaust system of the above-described embodiment is connected to the exhaust port 331.

Also, for example, even when a substrate processing apparatus including a processing furnace 402 illustrated in FIG. 10b is used to form a film, the present invention may be preferably applied. The processing furnace 402 includes a process container 403 forming a process chamber 401, a support 417 configured to support one or several wafers 200 in a horizontal orientation, a rotary shaft 455 configured to support the support 417 from below, a lamp heater 407 configured to radiate light to the wafer 200 in the process container 403, and a quartz window 403w configured to transmit light of the lamp heater 407. A gas supply port 432a configured to supply the source gas and a gas supply port 432b serving as a gas supply unit configured to supply the reactive gas are connected to the process container 403. The same gas supply system as the source gas supply system of the above-described embodiment is connected to the gas supply port 432a. The remote plasma unit 339b and the same gas supply system as the reactive gas supply system of the above-described embodiment are connected to the gas supply port 432b. The gas supply ports 432a and 432b are each provided at sides of ends of the wafer 200 loaded in the process chamber 401, that is, locations that do not face a surface of the wafer 200 loaded in the process chamber 401. An exhaust port 431 configured to exhaust the inside of the process chamber 401 is provided in the process container 403. The same exhaust system as the exhaust system of the above-described embodiment is connected to the exhaust port 431.

Even when these substrate processing apparatuses are used, film formation may be performed in the same sequence and under the same processing conditions as in the above-described embodiment or modifications, and the same effects as in the above-described embodiment or modifications may be obtained.

Also, the above-described embodiments, modifications and the like may be appropriately combined and used. Also, processing conditions in this case may be the same as, for example, the processing conditions of the above-described embodiment.

According to the present invention, it is possible to increase controllability of a composition ratio of a multi-element film containing a predetermined element; and at least one specific element selected from the group consisting of boron, oxygen, carbon and nitrogen.

Preferred Embodiments of the Present Invention

Hereinafter, preferred embodiments according to the present invention are supplementarily noted.
<Supplementary Note 1>
According to an aspect of the present invention, there is provided a method of manufacturing a semiconductor device or a substrate processing method including: forming a laminated film where a first film and a second film are laminated on a substrate by performing a cycle a predetermined number of times, the cycle including:
(a) forming the first film being free of a borazine ring structure and including a predetermined element and at least one element selected from the group consisting of oxygen, carbon and nitrogen; and
(b) forming the second film having the borazine ring structure and including at least boron and nitrogen.
<Supplementary Note 2>
In the method of Supplementary note 1, preferably, (a) includes performing a first set a predetermined number of times, the first set including (a-1) supplying a source gas including the predetermined element to the substrate; and (a-2) supplying at least one gas selected from the group consisting of a carbon-containing gas, a nitrogen-containing gas and an oxygen-containing gas to the substrate, and
(b) includes: performing a second set a predetermined number of times, the second set including: (b-1) supplying a borazine-based gas to the substrate; and (b-2) supplying at least one gas selected from the group consisting of the source gas and the nitrogen-containing gas to the substrate.
<Supplementary Note 3>
In the method of any one of Supplementary notes 1 and 2, preferably, the second film includes at least one element selected from the group consisting of the predetermined element and carbon. That is, the second film includes the predetermined element, boron and nitrogen, or the second film includes the predetermined element, boron, nitrogen and carbon, or the second film includes boron, nitrogen and carbon.
<Supplementary Note 4>
In the method of any one of Supplementary notes 1 through 3, preferably, the first film is free of boron.
<Supplementary Note 5>
In the method of any one of Supplementary notes 1 through 4, preferably, the first film includes at least one film selected from the group consisting of a film containing the predetermined element and oxygen, a film containing the predetermined element and nitrogen, a film containing the predetermined element and carbon, a film containing the predetermined element, oxygen and nitrogen, a film containing the predetermined element, carbon and nitrogen, a film containing the predetermined element, oxygen, carbon and nitrogen, and a film containing the predetermined element, oxygen and carbon.
<Supplementary Note 6>
In the method of any one of Supplementary notes 1 through 5, preferably, the first film is includes at least one film selected from the group consisting of an oxide film, a nitride film, a carbide film, an oxynitride film, a carbonitride film, an oxycarbonitride film and an oxycarbide film.
<Supplementary Note 7>
In the method of any one of Supplementary notes 1 through 6, preferably, the second film includes at least one film selected from the group consisting of a boron nitride film and a boron carbonitride film.
<Supplementary Note 8>
In the method of any one of Supplementary notes 1 through 7, preferably, a thickness of each of the first film and the second film ranges from 0.1 nm through 5 nm. Preferably, the thickness of each of the first film and the second film ranges from 0.1 nm through 3 nm, and more preferably, from 0.1 nm through 1 nm.
<Supplementary Note 9>
In the method of any one of Supplementary notes 2 through 8, preferably, each of the first set and the second set is performed one to fifty times. Preferably, each of the first set and the second set is performed one to thirty times, and more preferably, one to ten times.
<Supplementary Note 10>
In the method of any one of Supplementary notes 1 through 9, preferably, the laminated film includes a nano-laminated film where the first film and the second film are alternately laminated at nano level.

<Supplementary Note 11>

In the method of any one of Supplementary notes 1 through 10, preferably, (a) is performed first when the cycle is performed the predetermined number of times. That is, the first film is formed before the second film is formed. That is, before the second film is formed, the first film is formed first as a base of the formation. Then, the second film is formed on the already formed first film. That is, a bottommost part of the laminate film formed by lamination of the first film and the second film is formed by the first film.

<Supplementary Note 12>

In the method of any one of Supplementary notes 1 through 11, preferably, (a) is performed last when the cycle is performed the predetermined number of times. That is, when the second film is formed in the final cycle, a surface thereof is covered with the first film. That is, a topmost part of the laminate film formed by lamination of the first film and the second film is formed by the first film.

<Supplementary Note 13>

According to another aspect of the present invention, there is provided a substrate processing apparatus including:

a process chamber configured to accommodate a substrate;

a first gas supply system configured to supply a source gas including a predetermined element to the substrate in the process chamber;

a second gas supply system configured to supply at least one gas selected from the group consisting of a carbon-containing gas, a nitrogen-containing gas and an oxygen-containing gas to the substrate in the process chamber;

a third gas supply system configured to supply a borazine-based gas to the substrate in the process chamber; and a control unit configured to control the first gas supply system, the second gas supply system and the third gas supply system to form a laminated film where a first film and a second film are laminated on the substrate by performing a cycle a predetermined number of times, the cycle including: (a) forming the first film being free of a borazine ring structure and including the predetermined element and at least one element selected from the group consisting of oxygen, carbon and nitrogen; and (b) forming the second film having the borazine ring structure and including at least boron and nitrogen.

<Supplementary Note 14>

According to another aspect of the present invention, there is provided a program or a non-transitory computer-readable recording medium storing a program for causing a computer to perform a cycle a predetermined number of times to form a laminated film where a first film and a second film are laminated on a substrate, the cycle including:

(a) forming the first film being free of a borazine ring structure and including a predetermined element and at least one element selected from the group consisting of oxygen, carbon and nitrogen; and (b) forming the second film having the borazine ring structure and including at least boron and nitrogen.

What is claimed is:

1. A method of manufacturing a semiconductor device, comprising: forming a laminated film where a first film and a second film are laminated on a substrate by performing a cycle a predetermined number of times, the cycle comprising:

(a) forming the first film being free of a borazine ring structure and including a predetermined element and at least one element selected from the group consisting of oxygen, carbon and nitrogen; and (b) forming the second film having the borazine ring structure and including at least boron and nitrogen.

2. The method of claim 1, wherein (a) comprises: performing a first set a predetermined number of times, the first set comprising: (a-1) supplying a source gas including the predetermined element to the substrate; and (a-2) supplying at least one gas selected from the group consisting of a carbon-containing gas, a nitrogen-containing gas and an oxygen-containing gas to the substrate, and (b) comprises: performing a second set a predetermined number of times, the second set comprising: (b-1) supplying a borazine-based gas to the substrate; and (b-2) supplying at least one gas selected from the group consisting of the source gas and the nitrogen-containing gas to the substrate.

3. The method of claim 2, wherein each of the first set and the second set is performed one to fifty times.

4. The method of claim 1, wherein the second film further comprises at least one element selected from the group consisting of the predetermined element and carbon.

5. The method of claim 1, wherein the first film is free of boron.

6. The method of claim 1, wherein the first film comprises at least one film selected from the group consisting of a film containing the predetermined element and oxygen, a film containing the predetermined element and nitrogen, a film containing the predetermined element and carbon, a film containing the predetermined element, oxygen and nitrogen, a film containing the predetermined element, carbon and nitrogen, a film containing the predetermined element, oxygen, carbon and nitrogen, and a film containing the predetermined element, oxygen and carbon.

7. The method of claim 1, wherein the first film comprises at least one film selected from the group consisting of an oxide film, a nitride film, a carbide film, an oxynitride film, a carbonitride film, an oxycarbonitride film and an oxycarbide film.

8. The method of claim 1, wherein the second film comprises at least one film selected from the group consisting of a boron nitride film and a boron carbonitride film.

9. The method of claim 1, wherein a thickness of each of the first film and the second film ranges from 0.1 nm through 5 nm.

10. The method of claim 1, wherein the laminated film comprises a nano-laminated film where the first film and the second film are alternately laminated at a nano level.

11. The method of claim 1, wherein (a) is performed first when the cycle is performed the predetermined number of times.

12. The method of claim 1, wherein (a) is performed last when the cycle is performed the predetermined number of times.

13. A non-transitory computer-readable recording medium storing a program for causing a computer to perform a cycle a predetermined number of times to form a laminated film where a first film and a second film are laminated on a substrate, the cycle including:

(a) forming the first film being free of a borazine ring structure and including a predetermined element and at least one element selected from the group consisting of oxygen, carbon and nitrogen; and (b) forming the second film having the borazine ring structure and including at least boron and nitrogen.

* * * * *